(12) United States Patent
Sugiyama et al.

(10) Patent No.: US 6,573,527 B1
(45) Date of Patent: Jun. 3, 2003

(54) QUANTUM SEMICONDUCTOR DEVICE INCLUDING QUANTUM DOTS AND A FABRICATION PROCESS THEREOF

(75) Inventors: Yoshihiro Sugiyama, Kawasaki (JP); Yoshiaki Nakata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 970 days.

(21) Appl. No.: 08/753,598

(22) Filed: Nov. 27, 1996

(30) Foreign Application Priority Data

Apr. 5, 1996 (JP) .............................................. 8-084261
Aug. 12, 1996 (JP) .............................................. 8-212811

(51) Int. Cl.[7] .............................................. H01L 29/06
(52) U.S. Cl. .............................. 257/14; 257/15; 257/17; 257/18; 257/22
(58) Field of Search .............................. 257/14, 15, 17, 257/18, 22

(56) References Cited

U.S. PATENT DOCUMENTS 4,992,837 A  *  2/1991  Sakai et al. .................... 357/17
5,606,177 A  *  2/1997  Wallace et al. ................ 257/25

FOREIGN PATENT DOCUMENTS

JP          07231084          8/1995

OTHER PUBLICATIONS

"Structural and photoluminescence properties of growth–induced InAs Island columns in GaAs", Solomon et al.; pp. 2208–2211; J. Vac. Sci. Technol. B. 14(3), May/Jun. 1996.

G.S. Solomon et al., Vertically Aligned and Electronically Coupled Growth Induced InAs Islands in GaAs; Physical Review Letters, vol. 76, No. 6, pp. 952–955.

Qianghua Xie et al., Vertically Self–Organized InAs Quantum Box Islands On GaAs(100); Physical Review Letters, vol. 75, No. 13, Sep. 25, 1995.

* cited by examiner

*Primary Examiner*—Sara Crane
(74) *Attorney, Agent, or Firm*—Armstrong, Westerman & Hattori, LLP

(57) ABSTRACT

A quantum semiconductor device includes intermediate layers of a first semiconductor crystal having a first lattice constant and stacked repeatedly, and a plurality of quantum dots of a second semiconductor crystal having a second lattice constant different from the first lattice constant. The quantum dots are dispersed in each of the intermediate layers and form a strained heteroepitaxial system with respect to the corresponding intermediate layer. Each of the quantum dots has a height substantially identical with a thickness of the corresponding intermediate layer.

32 Claims, 22 Drawing Sheets

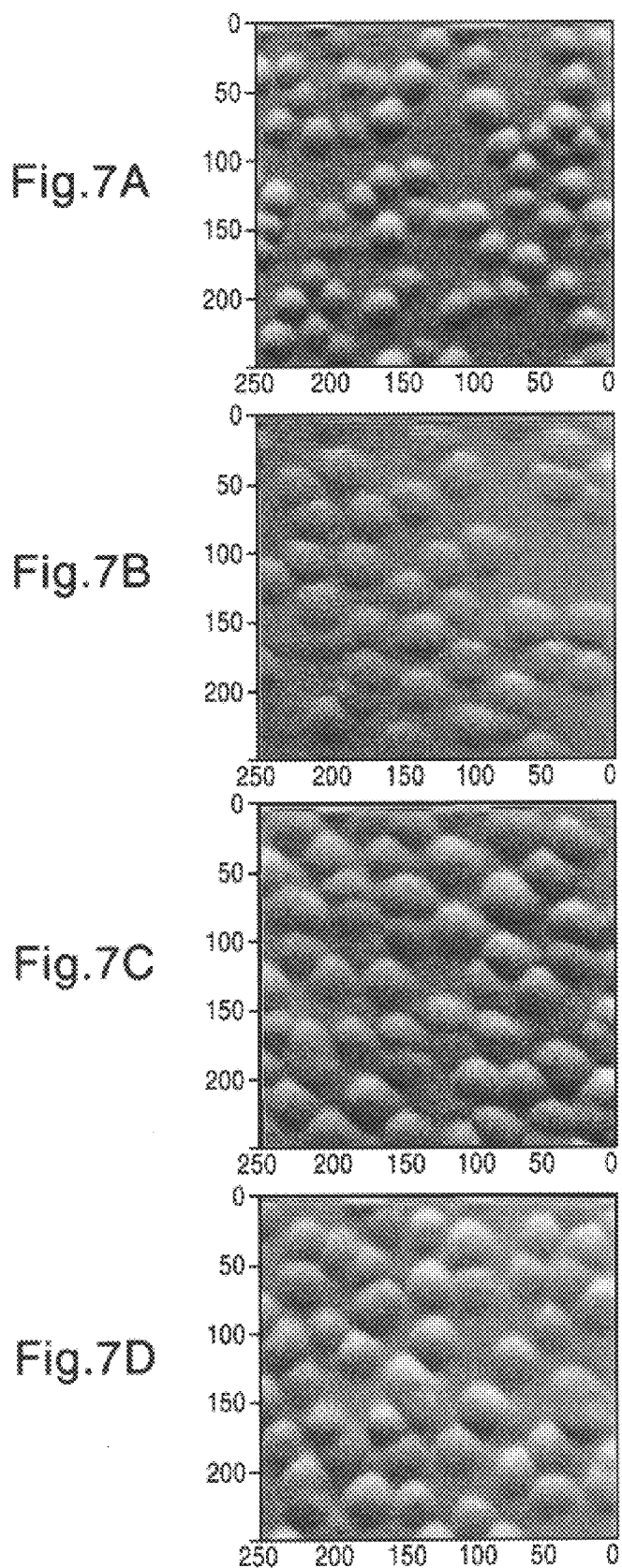

QUANTUM SEMICONDUCTOR DEVICE INCLUDING QUANTUM DOTS AND A FABRICATION PROCESS THEREOF

BACKGROUND OF THE INVENTION

The present invention generally relates to semiconductor devices and more particularly to a quantum semiconductor device including quantum dots and a fabrication process thereof.

In a so-called bulk crystal where there is no confinement of carriers, it is well known that the density of state of the carriers increases continuously and parabolically with energy. In a quantum well structure in which carriers are confined one-dimensionally in a crystal, there appear discrete quantum levels as is well known in the art. In such a case, the density of state of the carriers changes stepwise. Because of such a restriction imposed on the distribution of the carriers, a quantum well structure provides a narrow spectrum when used for an optical semiconductor device such as a laser diode, and the efficiency of laser oscillation is improved. Further, a quantum well structure is used in electron devices having a resonant tunneling barrier such as an RHET (Resonant Hot Electron Transistor) as an energy filter of carriers.

In a quantum well wire structure in which the degree of confinement of the carriers is increased further, the density of state of the carriers in the crystal is modified such that the density of state is a maximum at the bottom edge of each step. Thereby, the sharpness of the spectrum is increased further.

In an ultimate quantum dot structure in which the degree of carrier confinement is increased further, the density of state becomes discrete in correspondence to the discrete quantum levels. A system having such a discrete energy spectrum, in which transition of carriers occurs only discontinuously or stepwise, provides a very sharp spectrum when used for an optical semiconductor device even in a room temperature environment where the carriers experience substantial thermal excitation.

Further, the quantum dot structure is drawing the attention of scientists in relation to the problems of fundamental physics such as a phonon bottleneck problem of energy relaxation.

Conventionally, a quantum well structure has been formed readily and with reliability by using an MBE (Molecular Beam Epitaxy) process or an MOCVD (Metal Organic Chemical Vapor Deposition) process such that a very thin quantum well layer is sandwiched between a pair of barrier layers. On the other hand, a quantum well wire has been formed by growing thin semiconductor layers laterally on a so-called inclined semiconductor substrate having a stepped surface structure. Alternately, a quantum well wire may be formed by applying an electron beam lithography to an ordinary, one-dimensional quantum well structure.

Thus, various attempts have been made to form quantum dots by using an inclined substrate similarly to the case of forming a quantum well wire. However, such conventional attempts have faced a problem of controlling the stepped surface of the inclined substrate. Further, there tends to occur a mixing of elements at the boundary of the quantum dots formed such a manner. Thereby, a desired sharp transition of the composition is difficult in the quantum dots formed as such. Thus, there are few successful attempts in the approach that use an inclined substrate in combination with lateral epitaxial growth of semiconductor layers. In addition, an approach to use electron-beam lithography to form a quantum dot is also unsuccessful due to the damage caused in the epitaxial layers forming the quantum dot or a barrier layer at the time of patterning.

On the other hand, there has been a discovery that a quantum dot can be formed easily by using a so-called S-K (Stranski-Krastanow) mode growth that occurs in a strained heteroepitaxial system such as an InAs/GaAs heteroepitaxial structure at the initial period of heteroepitaxial growth. In an S-K mode growth, quantum dots are formed in the form of discrete islands on a substrate. For example, it is reported that an MBE growth of an InGaAs layer having an In-content of 0.5 on a GaAs substrate with a thickness of several molecular layers, results in a formation of islands of InGaAs each having a diameter of 30–40 nm on the GaAs substrate (Leonard, D., et al., Appl. Phys. Lett. 63, pp.3203–3205, 1993). Further, it is reported that islands of InGaAs having a diameter of 15–20 nm are formed on a GaAs substrate by an ALE (Atomic Layer Epitaxy) process with a mutual distance of about 100 nm (Mukai, K., et al., Jpn. J. Appl. Phys., 33, pp.L1710–L1712, 1994). Further, a similar quantum dot can be formed also by a MOVPE process (Oshinowo, J. et al., Appl. Phys. Lett. 65, (11), pp.1421–1423, 1994).

As the formation of a quantum dot in such a strained heteroepitaxial system is controlled by a strain energy formed at the heteroepitaxial interface, the formation of the quantum dot is substantially simplified as compared with the conventional process discussed previously. Further, the formation of a quantum dot on a strained heteroepitaxial system does not require a patterning process and is inherently free from damages. There is already a report claiming successful observation of a photoluminescence (PL) (Leonard, D., et al., op. cit.), in which it is reported that a broad PL peak is confirmed in the vicinity of 1.2 eV with a substantial intensity.

In the quantum dots formed by the S-K mode growth, however, the observed PL peak, although having a substantial intensity, spreads or diffuses substantially. For example, the half-height width FWHM (Full Width at Half Maximum) of the PL peak spreads over a range of 80–100 meV, probably due to the poor control of the size of the individual quantum dots. It should be noted that the PL wavelength corresponding to the foregoing PL peak energy is about 1.1 $\mu$m, which is shifted substantially on a shorter wavelength side with respect to the wavelength of 1.3 $\mu$m that is used commonly in the field of optical telecommunication and optical information processing. With the conventional S-K mode quantum dots, it has been difficult to tune the PL wavelength as necessary. As will be described later, the size of the quantum dot itself can be controlled to some degree by controlling the deposition temperature. However, the size of the quantum dots formed in such a manner changes variously. It is believed that it is such a variation of the size of the quantum dots that causes the foregoing unwanted spreading of the PL peak. Further, it is believed that conventional quantum dot structure thus formed by the S-K mode growth includes a substantial number of quantum dots that do not contribute to the photon emission.

Recently, Farad et al., (Farad. S., Appl. Phys. Lett., 68 (7), pp. 991–993, Feb. 12, 1996) has reported a successful observation of a PL wavelength in the 1.5 $\mu$m-band for an S-K mode quantum dot of InAs formed on an AlInAs buffer layer, which in turn is provided on an InP substrate with a lattice matching therewith. In this case, however, the value of FWHM for the observed PL spectrum exceeds 110 meV, indicating that there still remains a substantial problem in the size control of the individual quantum dots.

Thus, conventional S-K mode quantum dots have failed to provide a sharp spectrum of photon emission in the wavelength band of 1.3 μm or 1.5 μm, which is important for industrial applications. Further, a similar problem occurs also in electron devices such as an RHET. An energy filter formed by conventional S-K mode quantum dots performs poorly when the S-K mode quantum dots are used in a resonant-tunneling barrier of an RHET. In such a case, the desired sharp tunneling effect is not obtained.

SUMMARY OF THE INVENTION

Accordingly, it is a general object of the present invention to provide a novel and useful quantum semiconductor device including quantum dots and a fabrication process thereof wherein the foregoing problems are eliminated.

Another object of the present invention is to provide a quantum semiconductor device including a plurality of quantum dots formed on a heteroepitaxial system according to an S-K growth mode, wherein the quantum levels can be set independently to the size of the individual quantum dots, as well as a fabrication process of such a quantum semiconductor device.

Another object of the present invention is to provide a quantum semiconductor device including a plurality of quantum dots coupled with each other quantum-mechanically such that the plurality of mutually coupled quantum dots form collectively a plurality of discrete quantum levels.

Another object of the present invention is to provide a quantum semiconductor device, comprising:

a semiconductor substrate;

an active layer formed on said semiconductor substrate and including a quantum structure, said quantum structure comprising:

a plurality of intermediate layers stacked on each other repeatedly, each of said plurality of intermediate layers being formed of a first semiconductor crystal having a first lattice constant;

each of said intermediate layers including a plurality of quantum dots of a second semiconductor crystal having a second lattice constant different from said first lattice constant, said second semiconductor crystal forming thereby a strained system with respect to said first semiconductor crystal, each of said quantum dots in an intermediate layer having a height substantially identical with a thickness of said intermediate layer;

a quantum dot in an intermediate layer aligning with another quantum dot in an adjacent intermediate layer in a direction perpendicular to a principal surface of said semiconductor substrate;

each of said plurality of intermediate layers having a thickness equal to or smaller than a Bohr-radius of carriers in said intermediate layer.

Another object of the present invention is to provide an optical semiconductor device, comprising:

a semiconductor substrate;

a first cladding layer provided on said semiconductor substrate;

an active layer provided on said first cladding layer and including a quantum structure;

a second cladding layer provided on said active layer;

a first electrode provided on said semiconductor substrate for injecting carriers of a first type into said active layer via said first cladding layer;

a second electrode provided on said second cladding layer for injecting carriers of a second type into said active layer via said second cladding layer;

said quantum structure comprising:

a plurality of intermediate layers stacked on each other repeatedly, each of said plurality of intermediate layers being formed of a first semiconductor crystal having a first lattice constant;

each of said intermediate layers including a plurality of quantum dots of a second semiconductor crystal having a second lattice constant different from said first lattice constant, said second semiconductor crystal forming thereby a strained system with respect to said first semiconductor crystal, each of said quantum dots in an intermediate layer having a height substantially identical with a thickness of said intermediate layer;

a quantum dot in an intermediate layer aligning with another quantum dot in an adjacent intermediate layer in a direction perpendicular to a principal surface of said semiconductor substrate;

each of said plurality of intermediate layers having a thickness equal to or smaller than a Bohr-radius of carriers in said intermediate layer.

Another object of the present invention is to provide a method of fabricating a quantum semiconductor device including a quantum dot structure, comprising the steps of:

(a) growing quantum dots epitaxially on a substrate in the form of mutually isolated islands, each of said quantum dots forming a strained system with respect to said semiconductor substrate;

(b) growing a semiconductor layer epitaxially on said semiconductor substrate so as to bury said quantum dots to form an intermediate layer, said semiconductor layer forming said intermediate layer forming a lattice matching with respect to said semiconductor substrate;

(c) growing quantum dots epitaxially on said intermediate layer in the form of mutually isolated islands, each of said quantum dots grown on said intermediate layer forming a strained system with respect to said semiconductor substrate;

(d) growing a semiconductor layer epitaxially on said intermediate layer formed in said step (b) so as to bury said quantum dots formed in said step (c) as a next intermediate layer, said semiconductor layer forming said next intermediate layer forming a lattice matching with respect to said semiconductor substrate;

said steps (c) and (d) being carried out alternately and repeatedly, said intermediate layer being formed, in each of said steps (b) and (d) such that said intermediate layer has a thickness smaller than a height of said quantum dots in a state that said quantum dots are grown freely.

According to the present invention, the S-K mode quantum dots are aligned in a direction perpendicular to the principal surface of the semiconductor substrate and collectively form a single effective quantum dot isolated from other similar effective quantum dots. In other words, each of the effective quantum dots formed in such a manner is isolated and forms quantum levels similar to a real quantum dot. By controlling the number of stacks of the S-K mode quantum dots, it is possible to control the quantum levels formed in such a manner as desired. By forming the intermediate layer to have a thickness smaller than the height of the S-K mode quantum dots, mechanical as well as quantum mechanical coupling of the vertically aligned S-K mode quantum dots is enhanced.

Another object of the present invention is to provide a resonant-tunneling diode, comprising:

a semiconductor substrate;

a first quantum structure formed on said semiconductor substrate;

a barrier layer formed on said first quantum structure, said barrier layer forming a potential barrier; and a second quantum structure formed on said semiconductor substrate;

a cap layer provided on said second quantum structure;

a first electrode provided in electric contact with said semiconductor substrate; and a second electrode provided in electric contact with said cap layer;

each of said first and second quantum structures comprising:

a plurality of intermediate layers stacked on each other repeatedly, each of said plurality of intermediate layers being formed of a first semiconductor crystal having a first lattice constant;

each of said intermediate layers including a plurality of quantum dots of a second semiconductor crystal having a second lattice constant different from said first lattice constant, said second semiconductor crystal forming thereby a strained system with respect to said first semiconductor crystal, each of said quantum dots in an intermediate layer having a height substantially identical with a thickness of said intermediate layer;

a quantum dot in an intermediate layer aligning with another quantum dot in an adjacent intermediate layer in a direction perpendicular to a principal surface of said semiconductor substrate;

each of said plurality of intermediate layers having a thickness equal to or smaller than a Bohr-radius of carriers in said intermediate layer;

said quantum dots aligning in each of said first and second quantum structures forming collectively a single effective quantum dot having quantum levels.

According to the present invention, it is possible to eliminate the leakage current substantially completely at the tuned-off state of the quantum-resonant tunneling diode.

Other objects and further features of the present invention will become apparent from the following detailed description when read in conjunction with the attached drawings.

BRIEF DESCRIPTION OF THE DRAWINGS

FIGS. 7A–7D are diagrams showing the change of the radius and density of the S-K mode quantum dots with the progress of stacking in an AFM photograph, for the case in which the thickness of the intermediate layer is set to 3 nm;

DETAILED DESCRIPTION OF THE PREFERRED EMBODIMENTS

[PRINCIPLE]

First, the principle of the present invention will be described with reference to FIG. 1.

The inventor of the present invention has discovered previously, when experimenting with a formation of S-K mode quantum dots on an intermediate layer that covers further S-K mode quantum dots, that an S-K mode quantum dot thus formed on the intermediate layer aligns with a corresponding S-K mode quantum dot on the substrate in the direction generally perpendicular to the principal surface of the substrate (Sugiyama, Y. et al., Jpn. J. Appl. Phys., 35, Part 1, No. 2B, pp. 365–369, February, 1996). In the foregoing experiment, the intermediate layer establishes a lattice matching with the substrate and buries the S-K mode quantum dots formed on the substrate. In such a structure, it is believed that the intermediate layer deposited on the substrate accumulates a strain in correspondence to the part covering the underlying S-K mode quantum dots, and the atoms forming the upper S-K mode quantum dots tend to concentrate into such a strained part of the intermediate layer when the upper S-K mode quantum dots are formed.

Figure 1:
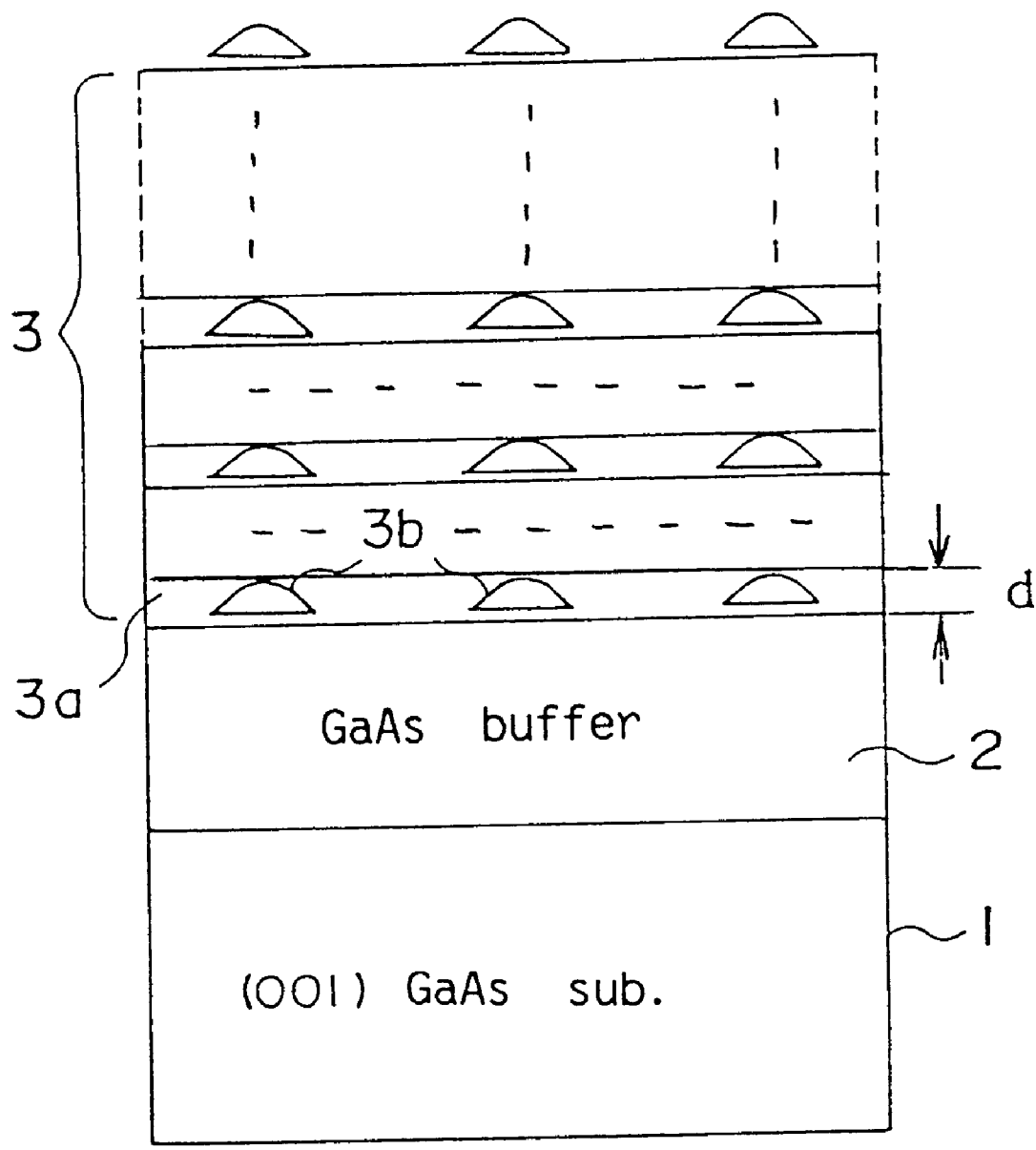
FIG. 1 is a diagram showing the fundamental construction of the quantum semiconductor device according to the present invention that includes S-K mode quantum dots.

FIG. 1 shows a quantum structure 3 that includes the vertically aligned S-K mode quantum dots schematically.

Referring to FIG. 1, the quantum structure 3 is formed on a buffer layer 2 of GaAs that in turn is formed on a (100)-oriented surface of a GaAs substrate 1. The buffer layer 2 is formed with a thickness of H 400 nm, and a plurality of GaAs intermediate layers 3a are stacked repeatedly on the foregoing buffer layer 2. Each of the intermediate layers 3a carries therein a plurality of quantum dots (islands) 3b of InAs, wherein each of the quantum dots 3b are isolated from other quantum dots 3b in each of the intermediate layers 3a.

It should be noted that InAs has a lattice constant different from that of GaAs forming the buffer layer 2 by about 7%. In other words, the quantum dots 3b form a strained heteroepitaxial system with respect to the buffer layer 2 and hence the substrate 1. In such a strained heteroepitaxial system, there appears a S-K mode growth at the initial period of epitaxial growth when forming an InAs layer, wherein such an S-K mode growth leads to the formation of the island structure of InAs on the surface of the GaAs buffer layer 2.

In the illustrated structure, it should be noted that the GaAs intermediate layer 3a buries the islands 3b of InAs, and the deposition of the intermediate layer 3a and the island 3b is repeated. Each of the islands 3a typically has-a diameter of about 20 nm and a height of about 5 nm and forms a quantum dot that confines carriers therein three-dimensionally in combination with the intermediate layer 3a having a larger bandgap and thus acting as a barrier layer.

The inventor of the present invention has discovered previously that the quantum dots 3b align generally perpendicularly to the principal surface of the substrate 1 when the intermediate layer 3a and the quantum dots 3b are deposited repeatedly and alternately as indicated in FIG. 1 (Sugiyama, Y., et al., op. cit.). As explained already, this phenomenon of vertical alignment of the quantum dots 3b is explained by the accumulation of strain in the part of the intermediate layer 3a that covers the underlying quantum dots 3b. The strain is caused by the difference in the lattice constant between the intermediate layer 3a and that of the quantum dot 3b that forms a strained heteroepitaxial system with the intermediate layer 3a, wherein the strain thus accumulated induces an island growth of InAs on the intermediate layer 3a in correspondence to the part where the strain is accumulated.

Figure 2:
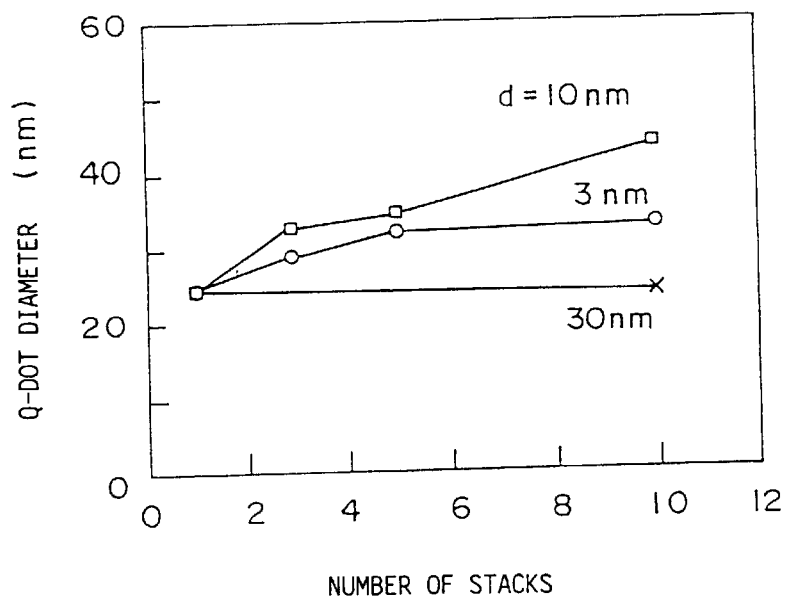
FIG. 2 is a diagram showing the relationship between the diameter of S-K mode quantum dots and the number of stacks of the S-K mode quantum dots in the structure of FIG. 1.

On the other hand, the foregoing investigation of the inventor also revealed that the diameter of the quantum dots tends to increase with stacking or repetition of deposition of the intermediate layer 3a and the corresponding quantum dots 3b as indicated in FIG. 2. In the example of FIG.2, it should be noted that the quantum dots 3b are formed by an MBE process at a temperature of about 510° C.

Referring to FIG. 2 showing the case where the thickness d of the intermediate layer 3a is set to 10 nm, it will be noted that the diameter of the quantum dots 3b increases gradually with the progress of stacking of the intermediate layers 3a and the quantum dots 3b. On the other hand, the inventor of the present invention has newly discovered that, while the diameter of the quantum dots 3b increases slightly with the deposition for the first five layers, no further increase of the diameter occurs in the quantum dots 3b in the subsequent deposition of the intermediate layer 3a and the quantum dots 3b, when the thickness d of the intermediate layer 3a is set to 3 nm. It should be noted that this value of the thickness d is smaller than the height (5 nm) of the quantum dots 3b. Further, it was observed that the increase of the diameter of the quantum dots 3b does not occur when the thickness d of the intermediate layer 3a is set to about 30 nm or more.

Figure 3:
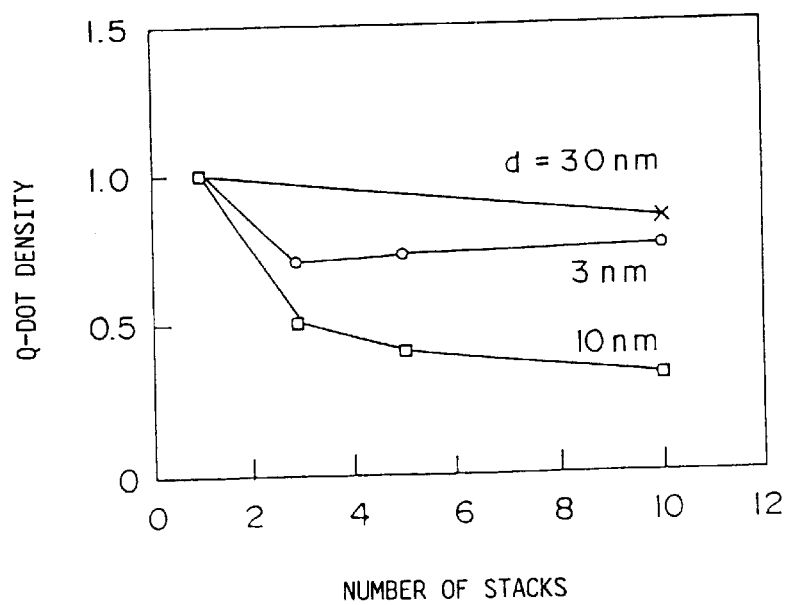
FIG. 3 is a diagram showing the relationship between the density of the S-K mode quantum dots and the number of stacks of the S-K mode quantum dots in the structure of FIG. 1.

FIG. 3 shows the relationship between a density of the quantum dots 3b and the number of stacks, wherein the density of the quantum dots 3b indicates the number of the quantum dots 3b included in a unit area of the intermediate layer 3a. It should be noted that the density of the quantum dots 3b reduces inevitably with increasing diameter of the quantum dots as long as the supply rate of In and As to the surface of the intermediate layer 3a is held constant. Thus, the relationship of FIG. 3 is complementary to the relationship of FIG. 2.

Figure 4:
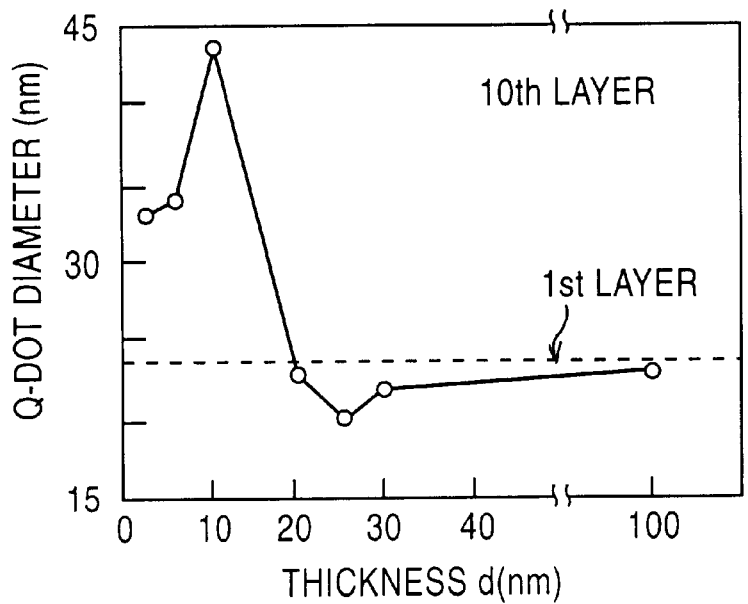
FIG. 4 is a diagram showing the relationship between the diameter of the S-K mode quantum dots and the thickness of intermediate layers in the structure of FIG. 1.

FIG. 4 shows the relationship between the diameter of the uppermost quantum dots 3b and the thickness of the intermediate layer 3a for the case in which ten such intermediate layers 3a are stacked together with corresponding quantum dots 3b. In FIG. 4, it will be noted that the diameter of the quantum dots 3b becomes maximum when the thickness of the intermediate layer 3a is set to 10 nm. In this case, the diameter of the quantum dots 3a reaches as much as 45 nm. In correspondence to this, the density of the quantum dots 3b in the uppermost intermediate layer 3a becomes minimum when the thickness of the layer 3a is set to 10 nm.

Further, FIG. 4 indicates that the increase of the diameter of the quantum dots 3b with the stacking of the intermediate layer 3a can be successfully suppressed by setting the thickness of the intermediate layer 3a to be 5 nm or less, preferably 3 nm or less. Similarly, FIG. 5 indicates that the decrease of the quantum dot density is suppressed effectively when the thickness of the intermediate layer 3a is set to 5 nm or less, preferably 3 nm or less. Further, the diameter of the quantum dots 3b does not increase anymore after stacking of initial five layers when the thickness of the intermediate layer 3a is set to be 3 nm or less as already explained with reference to FIG. 2.

The foregoing results indicate that the quantum dots 3b are formed in alignment with the underlying quantum dots 3b in a one-to-one relationship when the thickness of the intermediate layer 3a is set to be about 3 nm or less. In such a case, the thickness of the intermediate layer 3a is substantially smaller than the Bohr radius of the carriers, which is 12 nm in a GaAs crystal. Thus, the wavefunction of the carriers in a quantum dot 3b penetrates into an adjacent quantum dot 3b located above. Similarly, the wavefunction of the carriers in a quantum dot 3b penetrates into an underlying quantum dot 3b. Thereby, the vertically aligned quantum dots 3b collectively act as a single quantum dot that has a wavefunction spreading throughout the vertically aligned quantum dots 3b.

Figure 5:
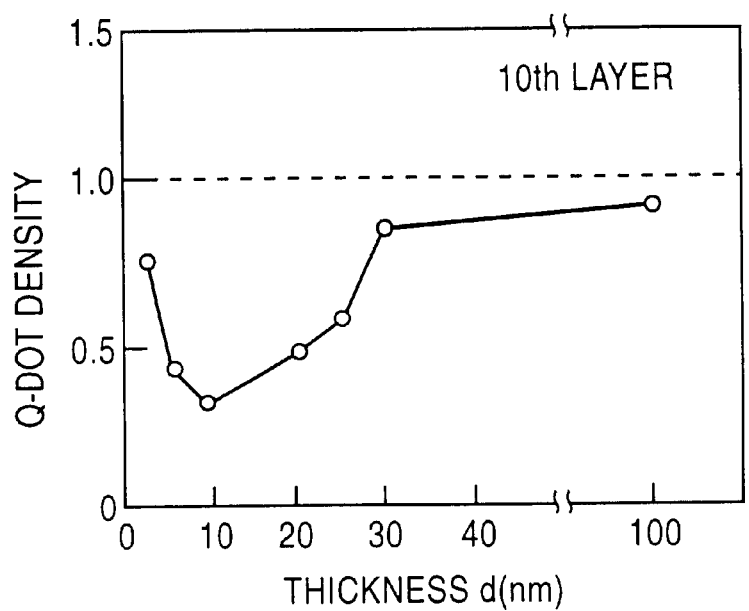
FIG. 5 is a diagram showing the relationship between the density of the S-K mode quantum dots and the thickness of the intermediate layers in the structure of FIG. 1.

When the thickness of the intermediate layer 3a is about 10 nm, on the other hand, the density of the quantum dots 3b is different between the uppermost layer and the lowermost layer as indicated in FIG. 3 or FIG. 5, and the one-to-one correspondence is lost in the vertically aligned quantum dots 3b.

Figure 6:
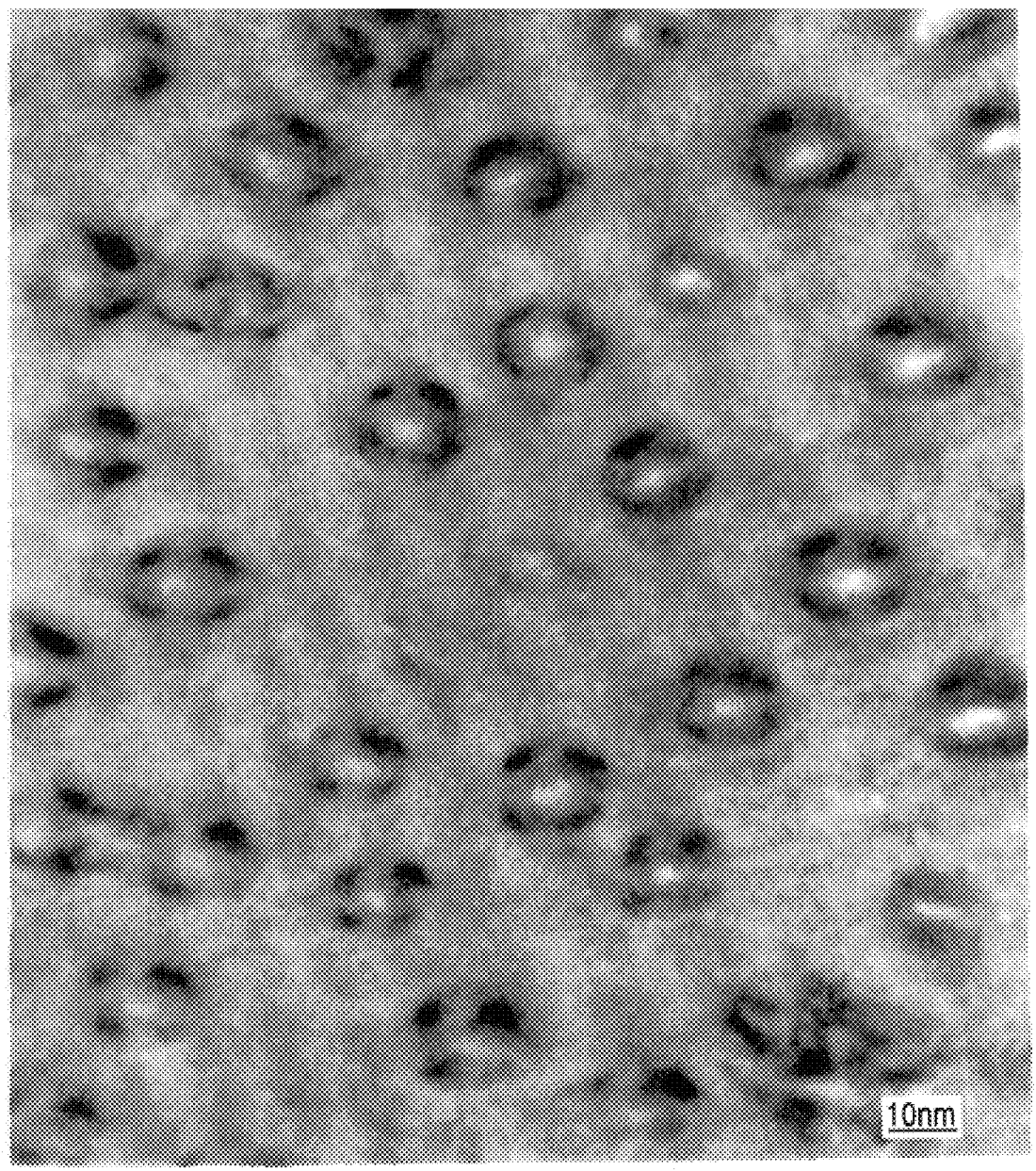
FIG. 6 is a diagram showing the S-K mode quantum dots used in the present invention in a plan view TEM photograph.
Figure 8A:
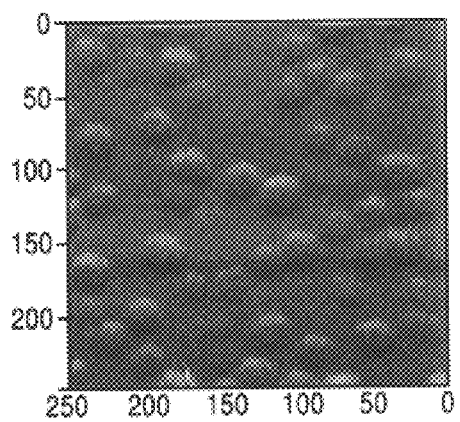
FIGS. 8A–8D are diagrams showing the change of the radius and density of the S-K mode quantum dots with the progress of stacking in an AFM photograph, for the case in which the thickness of the intermediate layer is set to 10 nm.
Figure 8B:
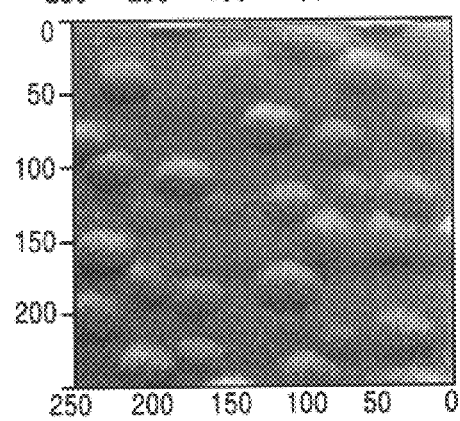
Figure 8C:
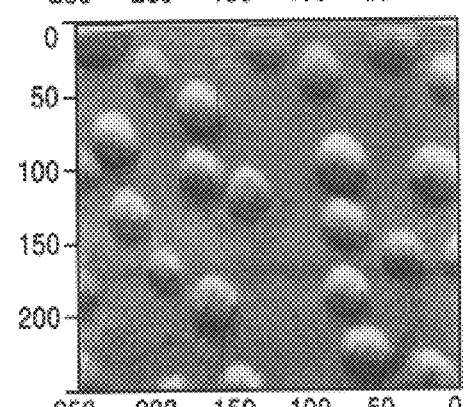
Figure 8D:
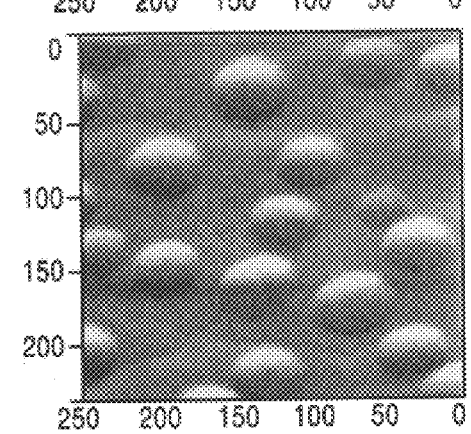

FIG. 6 is a planar TEM photograph of the quantum structure of FIG. 1.

As can be seen in FIG. 6, each of the quantum dots 3b has a generally circular shape or disk shape, and the quantum dots 3b are scattered with a generally uniform interval. Further, it should be noted that the variation of the diameter of individual quantum dots 3b is small.

FIGS. 7A–7D show respectively an AFM (Atomic Force Microscope) image of the quantum dots 3b in the first layer, third layer, fifth layer and tenth layer for the structure in which the thickness d of the quantum well layer 3a is set to 3 nm. Thus, FIGS. 7A–7D correspond to the case in which the thickness d is set to 3 nm in FIG. 2.

Referring to FIGS. 7A–7D, the quantum dots 3b of the first layer shown in FIG. 7A are slightly smaller than the quantum dots 3b of the third or later layers shown in FIGS. 7B–7D. Further, the number of the first layer quantum dots 3b is slightly larger than the number of the quantum dots 3b of the third or later layers. However, there is little difference in the size or number for the quantum dots 3b in the third or later layers.

FIGS. 8A–8D show an AFM image of the quantum dots 3b respectively in the first, third, fifth and tenth layers for the case in which the thickness d of the intermediate layer 3a is set to 10 nm. Thus, FIGS. 8A–8D correspond to the case in which the thickness d is set to 10 nm in FIG. 2.

Referring to FIGS. 8A–8D, the size of the quantum dots 3b increases with increasing number of the stacked layers. Thereby, the density of the quantum dots decreases with the increase of the number of the stacked layers. Thus, there can be a case in which a plurality of quantum dots in the first layer shown in FIG. 8A correspond to a single quantum dot in the tenth layer shown in FIG. 8D. In such a case, a very complex quantum structure is formed as a result of the quantum mechanical coupling of these quantum dots.

Figure 9:
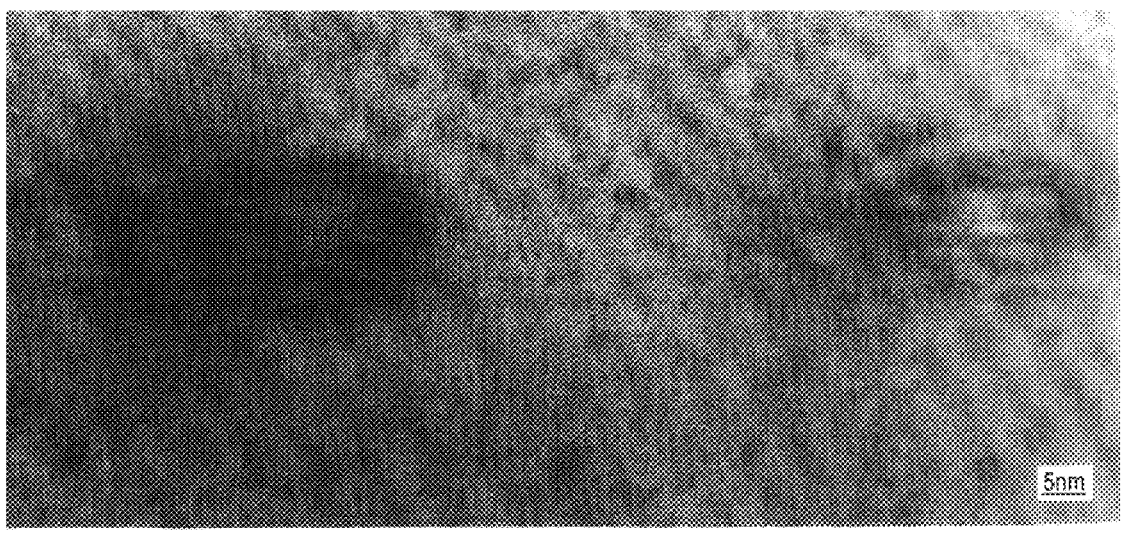
FIG. 9 is a diagram showing the alignment of the S-K mode quantum dots in a cross-sectional TEM photograph for the case in which the thickness of the intermediate layer is set to 2 nm.

FIG. 9 shows a cross-sectional TEM photograph of the quantum structure 3 for the case in which five intermediate layers 3a each having a thickness of 2 nm are stacked. Further, FIG. 10 shows a similar cross-sectional TEM photograph of the structure 3 for the case in which the thickness of the intermediate layer 3a is 3 nm.

In such a case in which the thickness of the intermediate layers 3a is set smaller than the height of the quantum dots 3b, it is expected that a quantum dot 3b projects beyond the upper surface of the corresponding intermediate layer 3a. Further, it is expected that the surface morphology of the intermediate layer 3a would be deformed or undulated in correspondence to such a projection of the quantum dots 3b. However, the result of FIGS. 9 and 10 clearly indicates that each of the intermediate layers 3a maintains a flat, planar upper major surface. This means that such a deposition of the intermediate layer 3a on a freely grown quantum dot 3b causes a deformation not in the morphology of the intermediate layers 3a but in the quantum dot 3b. As a result of such a deformation, the original height of the freely grown quantum dots 3b decreases substantially to the thickness of the intermediate layer 3a. Further, there is a possibility that a quantum dot 3b contacts with the intermediate layer 3a located immediately thereabove directly.

Figure 10:
FIG. 10 is a diagram showing the alignment of the S-K mode quantum dots in a cross-sectional TEM photograph for the case in which the thickness of the intermediate layer is set to 3 nm.

Further, as demonstrated in the TEM photographs of FIGS. 9 and 10, the quantum dots 3b are indeed vertically aligned, wherein it is also noted that the vertically aligned quantum dots do not merge with each other even when the thickness of the intermediate layer 3a is decreased to 2 or 3 nm. It should be noted that FIGS. 9 and 10 clearly indicate that the layered structure is maintained even in such a case.

In such a quantum structure, therefore, the intermediate layer 3a immediately above a quantum dot 3b may have a thickness of only one or two atomic layers. Thus, it should be easily understood that the intermediate layer 3a experiences a severe deformation in the crystal structure in correspondence to the part located immediately above the quantum dots 3b. Because of such a severe deformation of the crystal structure, the intermediate layer 3a does not form a usual Kronig-Penny type potential barrier, and the carriers in the vertically aligned quantum dots form an effectively single quantum dot, by causing a quantum mechanical coupling accompanying a tunneling effect. Further, it is believed that this severe deformation of the crystal structure is the reason why the quantum dots 3b are aligned vertically as already noted.

Figure 11:
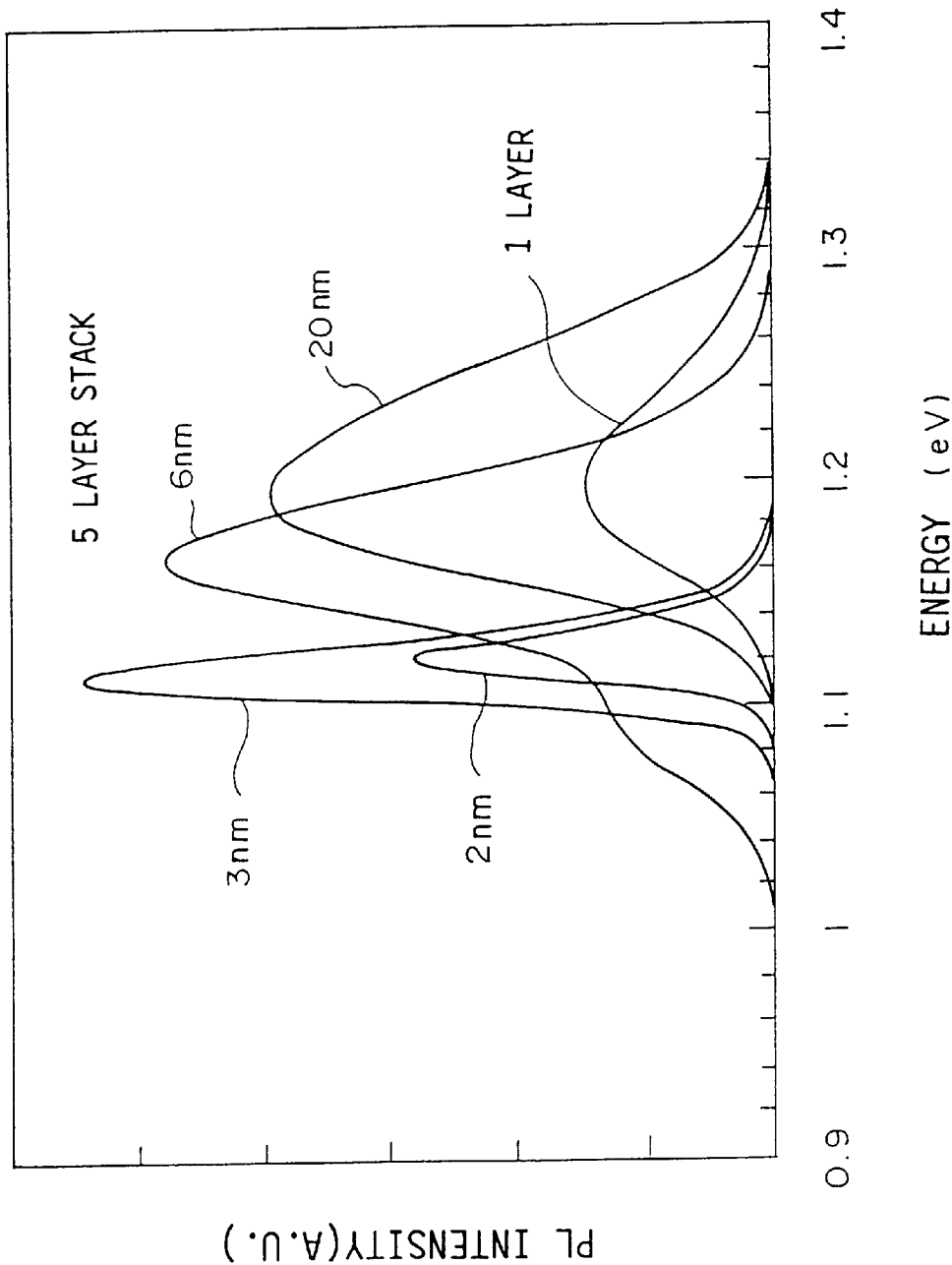
FIG. 11 is a diagram showing the PL spectrum of the vertically aligned S-K mode quantum dots.

FIG. 11 shows the PL spectrum of the structure of FIG. 1 at 77 K in which the intermediate layer 3a and the quantum dots 3b are stacked five times.

Referring to FIG. 11, the PL intensity is small and the spectrum is diffused in the structure in which the quantum dots 3b are arranged in only one layer. This indicates that the quantum dots 3b as formed have substantial variation in the size.

On the other hand, the intensity and the sharpness of the PL spectrum increase with increasing number of stacks of the intermediate layers 3a, Particularly, the intensity and sharpness of the PL peak is improved remarkably in the quantum structure in which the intermediate layer 3a having a thickness of 2–3 nm are stacked five times. Further, the peak wavelength shifts slightly in such a stacked quantum structure on the longer wavelength side, indicating that the quantum dots 3b form collectively an effective quantum dot by way of a quantum mechanical coupling.

FIG. 11 also indicates that the PL peak is diffused substantially when the thickness of the intermediate layer 3a is set to 6 nm or 20 nm.

Thus, it is concluded that the degree of quantum mechanical coupling increases significantly by setting the thickness of the intermediate layer 3a to be approximately equal to or smaller than the height of the freely-grown quantum dot 3b.

Figure 12:
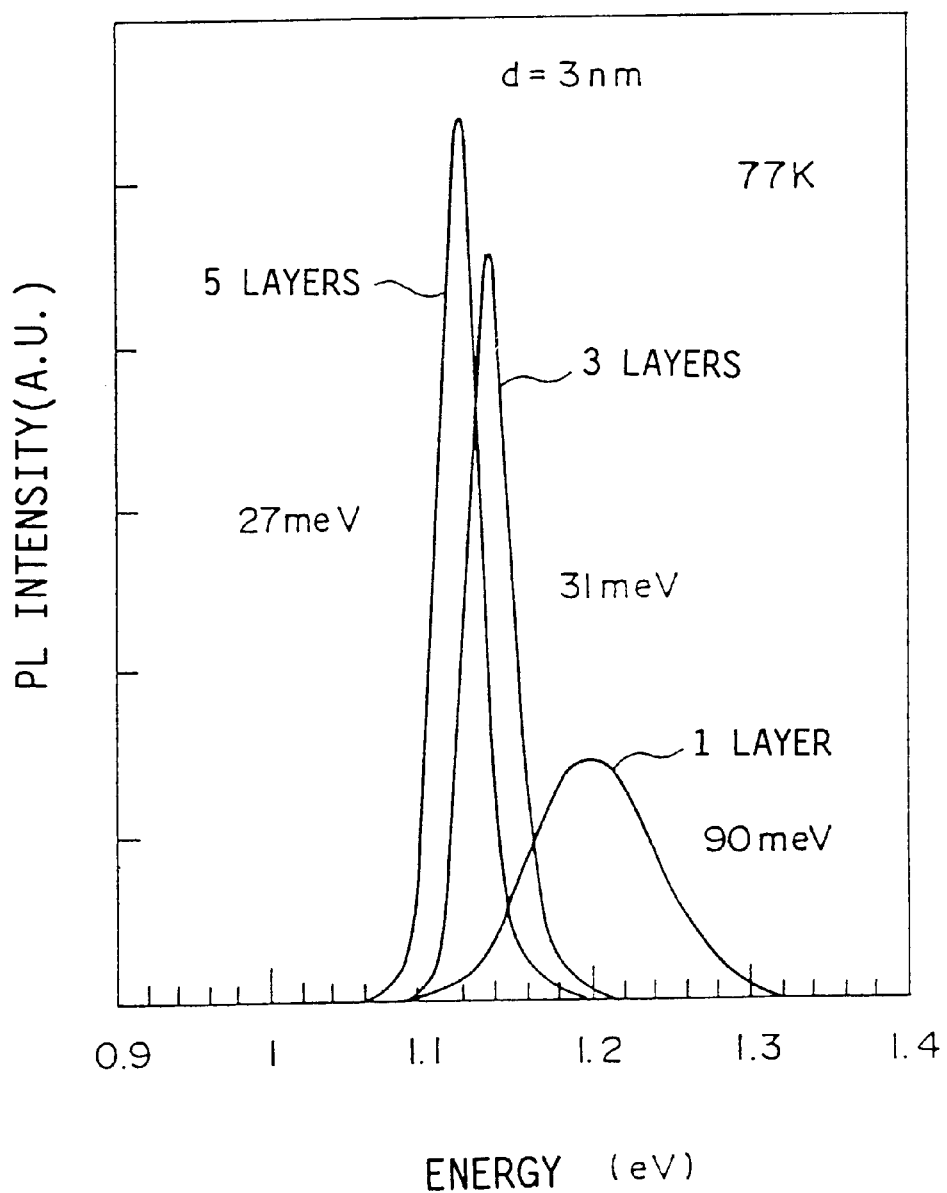
FIG. 12 is another diagram showing the PL spectrum of the vertically aligned S-K mode quantum dots.

FIG. 12 shows the PL spectrum of the quantum structure of FIG. 1 for the case in which the thickness of the intermediate layer 3a is set to 3 nm as a function of the number of stacks of the quantum dots 3b.

Referring to FIG. 12, a very sharp PL peak is observed already at the energy of about 1.13 eV when the number of stacks is three, provided that the thickness of the intermediate layer 3a is set to 3 nm. With a further increase of the number of stacks to five, the height of the PL peak increases further, while the peak position of the PL peak is shifted to a lower energy side or longer wavelength side. This clearly supports the interpretation that the size of the effectively single quantum dot formed as a result of the quantum mechanical coupling of the quantum dots 3b increases with increasing number of stacks.

Figure 13:
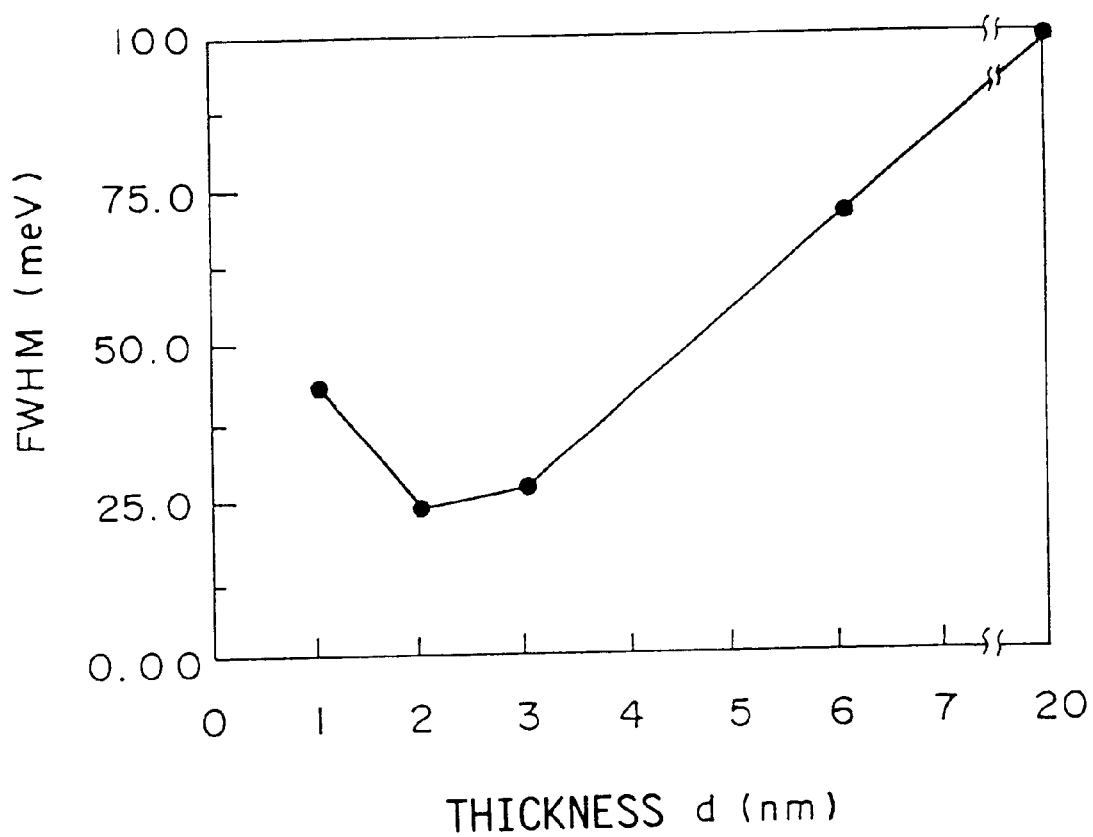
FIG. 13 is a diagram showing the relationship between the thickness of the intermediate layers and the sharpness of the PL spectrum for the quantum structure of FIG. 1.

FIG. 13 shows the FWHM (Full Width at Half Maximum) of the PL peak of the stacked quantum structure 3 of FIG. 1 as a function of the thickness d of the intermediate layer 3a, for the case in which the quantum dots 3b are stacked five times.

As can be seen in FIG. 13, the FWHM value of the PL peak becomes minimum when the thickness of the intermediate layer 3a is set to 2–3 nm, indicating the existence of an extremely effective quantum mechanical coupling between the vertically aligned quantum dots 3b. When the thickness of the intermediate layer 3a is decreased further to about 1 nm, on the other hand, the FWHM value starts to increase.

Summarizing the above, the vertically aligned quantum dots 3b of the quantum structure 3 of FIG. 1 form an effectively single quantum dot by establishing an efficient quantum mechanical coupling, when the thickness of the intermediate layers 3a is set to be generally equal to or smaller than the height of the quantum dots 3b in the as-grown state. The size of the individual quantum dots does not change substantially even when the stacking of the intermediate layers is repeated. Thus, by repeating such a stacking as desired, it is possible to form an effectively single quantum dot of a desired size and hence of desired energy.

Figure 14:
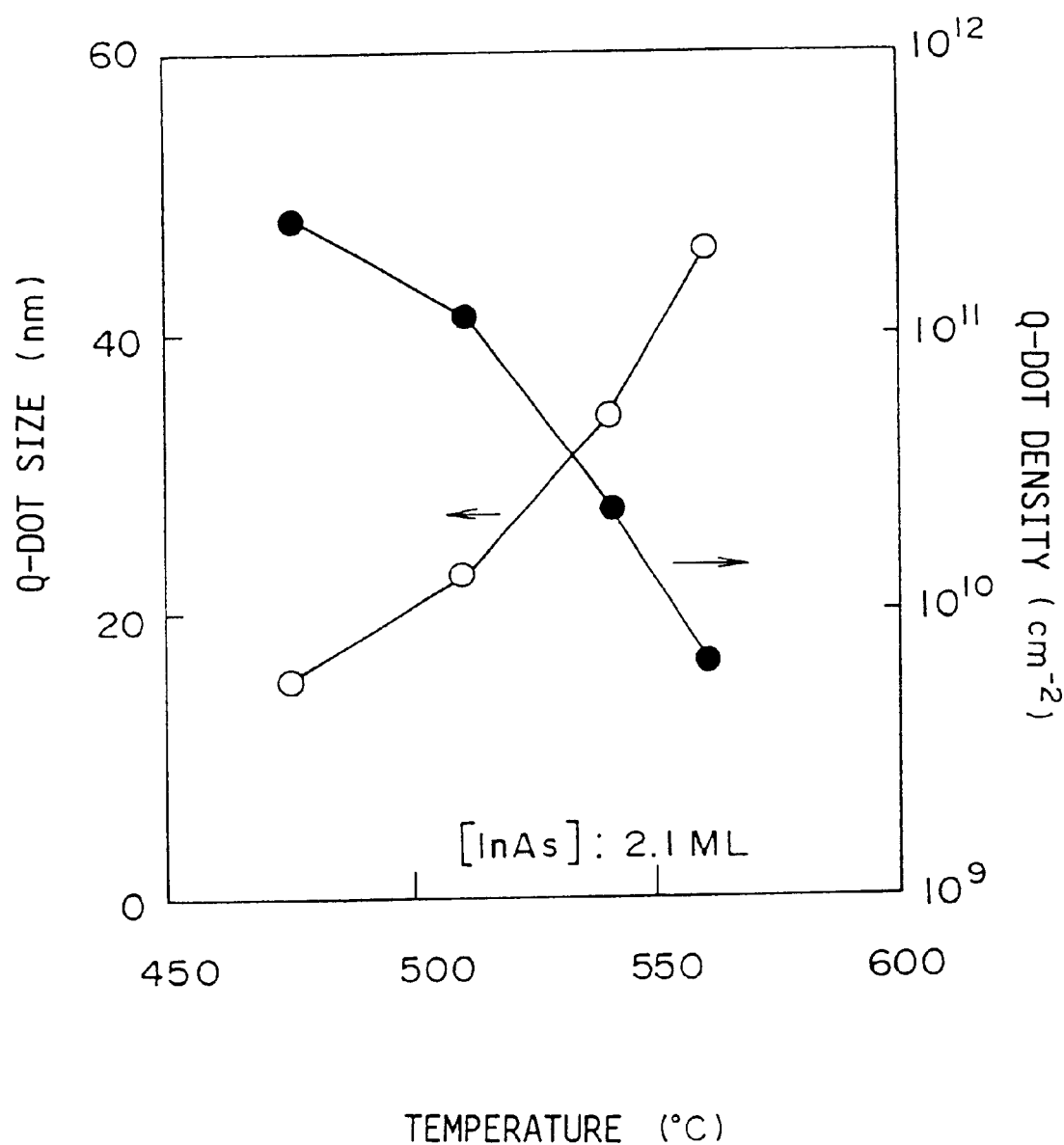
FIG. 14 is a diagram showing the relationship between a deposition temperature and the size and density of the S-K mode quantum dots.

FIG. 14 shows the relationship between size of the quantum dots 3b and the substrate temperature that is employed when forming the quantum dots 3b.

Referring to FIG. 14, it should be noted that there is a tendency that the size of the quantum dots 3b increases with increasing substrate temperature. Associated therewith, the density of the quantum dots 3b on the intermediate layer 3a decreases with the substrate temperature. In other words, it is possible to control the size of the quantum dots 3b to some extent by controlling the substrate temperature at the time of the formation of the quantum dots 3b.

[FIRST EMBODIMENT]

Figure 15:
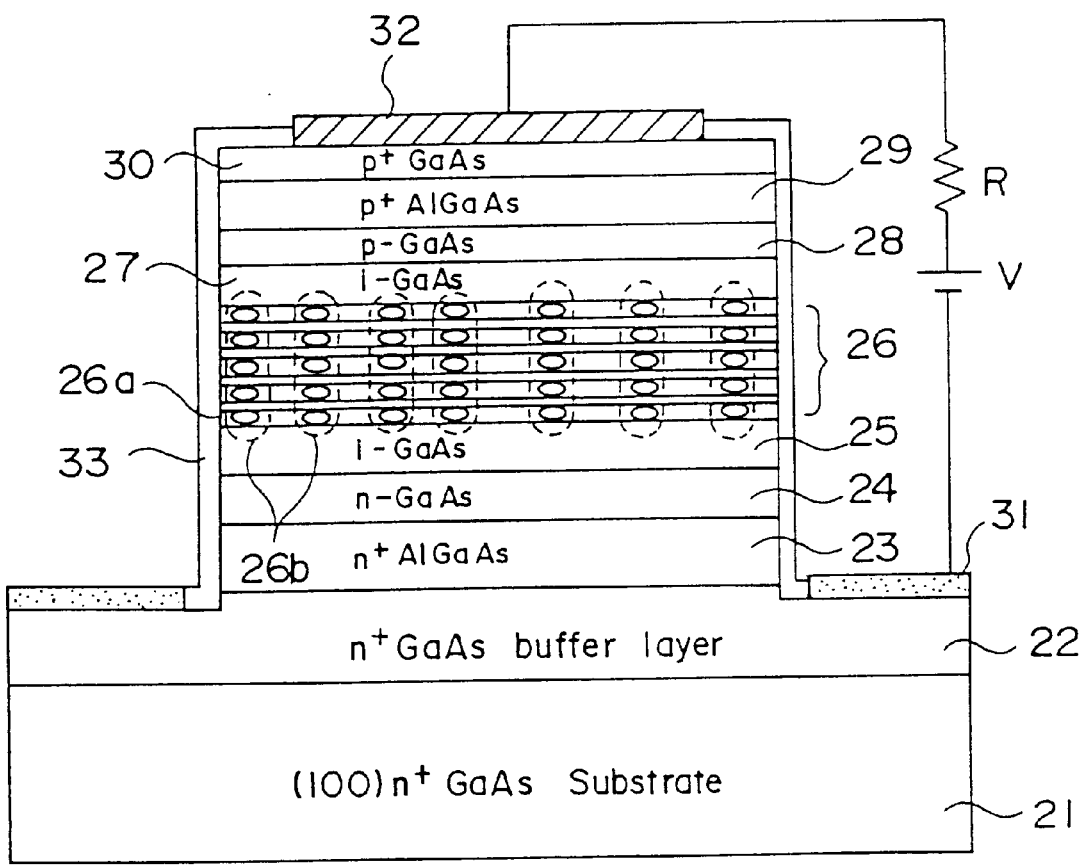
FIG. 15 is a cross-sectional diagram showing the construction of a light-emitting diode according to a first embodiment of the present invention.

FIG. 15 shows the construction of a light-emitting diode according to a first embodiment of the present invention.

Referring to FIG. 15, the light-emitting diode 20 is formed on a (100)-oriented surface of a substrate 21 of $n^+$-type GaAs, wherein a buffer layer 22 of $n^+$-type GaAs covers the foregoing(100)-oriented surface of the substrate 21 epitaxially with a thickness of 400–500 nm.

On the buffer layer 22, a lower cladding layer 23 of $n^+$-type AlGaAs is formed epitaxially with a thickness of typically about 300 nm, and a waveguide layer 24 of n-type GaAs is provided on the cladding layer 23 also epitaxially with a thickness of typically 100 nm. Further, an undoped layer 25 of GaAs is provided on the waveguide layer 24 epitaxially with a thickness of about 20 nm as a part of the quantum well structure.

The layers 22–25 are formed for example by an MBE process by setting the substrate temperature at 620° C., while maintaining the pressure inside a reaction chamber in which the deposition is made by setting the As pressure at $6 \times 10^{-6}$ Torr for preventing the dissociation of As.

After the layer 25 is formed in such a manner, the supply of the Ga source is interrupted, and the substrate temperature is lowered to 510° C. After the substrate temperature has reached 510° C., a molecular beam of In is introduced into the reaction chamber, and a growth of an InAs layer is made epitaxially on the foregoing GaAs layer 25 with a thickness corresponding to 1.8 molecular layers of InAs. After the deposition of InAs, an annealing process is applied for about 30 seconds, and first layer islands of InAs are formed on the layer 25 with a height of about 5 nm and a diameter of about 20 nm. See FIG. 14.

After the first InAs islands 26b are formed in such a manner, a first intermediate layer 26a of undoped GaAs is deposited epitaxially with a thickness of 2–3 nm, such that the first intermediate 26a buries the InAs islands 26b underneath. Thereby, the InAs islands 26b form quantum dots dispersed in the first intermediate layer 26a. During the deposition of the first intermediate layer 26a, the InAs islands 26b undergo a deformation from the as-grown state, and the quantum dots 26b have a decreased height of 2–3 nm corresponding to the thickness of the first intermediate layer 26b.

The foregoing formation of the InAs islands 26b and the deposition of the intermediate layer 26a are repeated four times, and a quantum well structure 26 is obtained, in which the quantum dots 26b align vertically similarly to the structure of FIG. 1. As a result of such a repetitive deposition, the quantum semiconductor structure has an overall thickness of about 20 nm. The quantum well structure 26 thus formed forms the active layer of the light-emitting diode.

It should be noted that, in such a structure in which the thickness of the intermediate layer 26a is smaller than the height of the InAs islands 26b in the as-grown or freely grown state, there is a possibility that a quantum dot 26b contacts directly with an adjacent quantum dot 26b in the upper or lower layers. Even in such a case, the upper and lower quantum dots 26b do not merge with each other, and the layered structure of the quantum structure 26 is maintained. Further, there may be one or several atomic layers of GaAs intervening between the vertically aligned quantum dots 26b.

In the light-emitting diode, another undoped GaAs layer 27 is formed epitaxially on the foregoing quantum well structure 26, and an upper waveguide layer 28 of p-type GaAs and an upper cladding layer 29 of $p^+$-type AlGaAs are formed consecutively thereon with respective thicknesses of 120 nm and 300 nm. Further, a cap layer 30 of $p^+$-type GaAs is formed on the layer 29 with a thickness of 50 nm. The deposition of the layers 27–30 may be made according to an MBE process.

The layered semiconductor structure thus formed is then subjected to a mesa etching process until the buffer layer 22 of GaAs is exposed, and a protective film 33 of SiN or the like is provided on the mesa structure thus formed. Further, an electrode 31 is formed on the buffer layer 22 and another electrode 32 is formed in the cap layer 30.

In the light-emitting diode of such a construction, the quantum dots 26b are aligned generally perpendicularly to the principal surface of the substrate with a mutual quantum mechanical coupling, and a very sharp spectrum of optical emission is obtained at an energy of about 1.1 eV when operated at a temperature of 77 K.

[SECOND EMBODIMENT]

Figure 16:
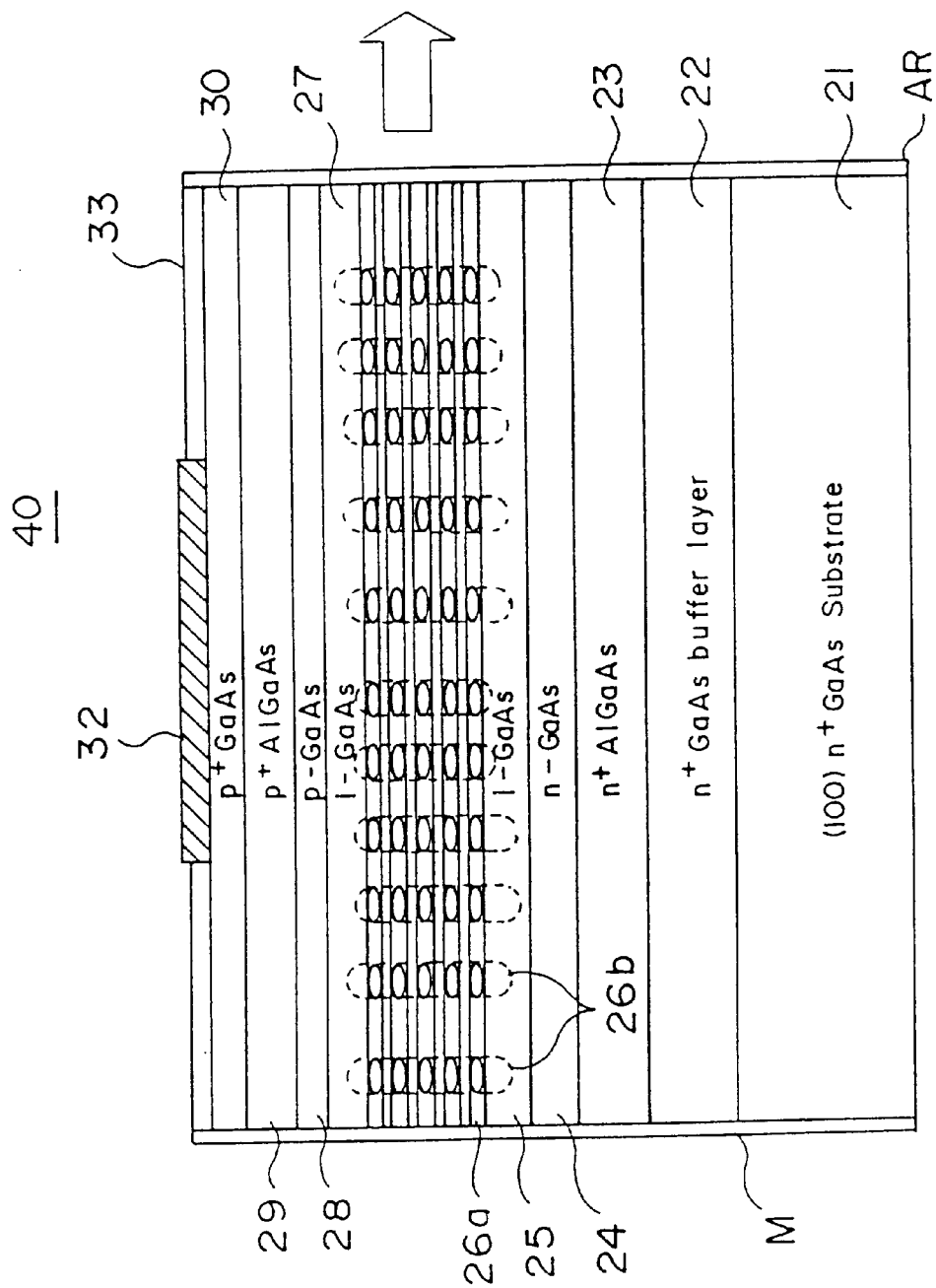
FIG. 16 is a cross-sectional diagram showing the construction of an edge-emission type laser diode according to a second embodiment of the present invention.

FIG. 16 shows the cross-sectional diagram of an edge-emission type laser diode 40 according to a second embodiment of the present invention, wherein those parts described previously are designated by the same reference numerals and the description thereof will be omitted. Further, an illustration of the transversal cross section of the device of FIG. 16 will be omitted, as the laser diode 40 has a transversal cross section substantially identical to that of the light-emitting diode of FIG. 15.

Referring to FIG. 16, a mirror M and a semi-transparent mirror AR are provided respectively on mutually opposing edge surfaces of the laser diode 40. Thereby, the mirror M and the semi-transparent mirror AR form an optical cavity as usual in a laser diode, and the optical beam produced by the vertically aligned quantum dots 26b is amplified by stimulated emission as it is reflected back and forth between the mirror M and the semi-transparent mirror AR. The optical beam thus amplified is emitted from the edge where the semi-transparent mirror AR is provided.

Further, it is possible to provide a diffraction grating between the cladding layer 23 and the waveguide layer 24 in place of providing the mirror M and the semi-transparent mirror AR. In this case, the laser diode 40 forms a so called DFB (Distributed Feedback) laser diode.

[THIRD EMBODIMENT]

Figure 17:
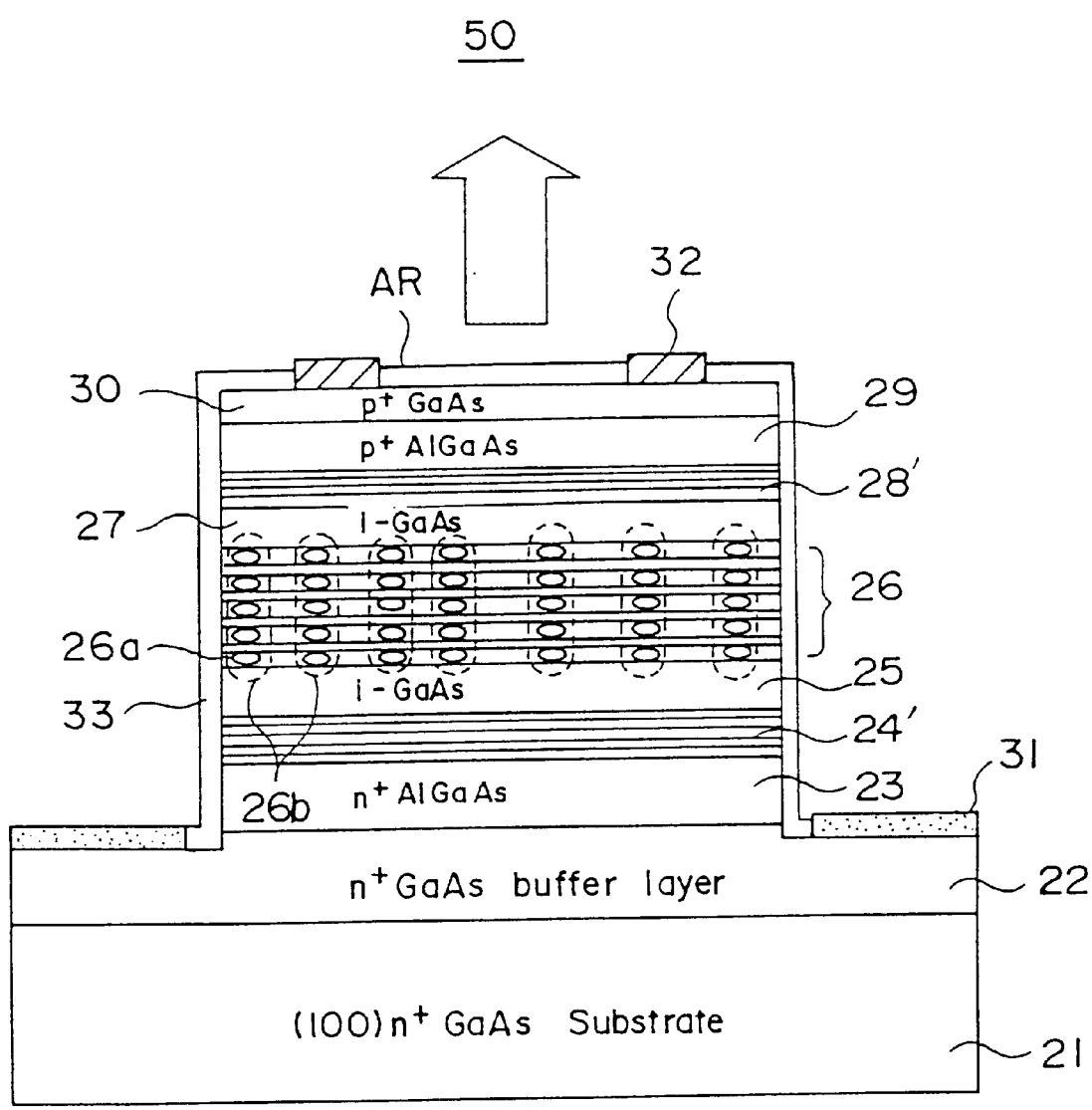
FIG. 17 is a diagram showing the construction of a planar laser diode according to a third embodiment of the present invention.

FIG. 17 shows the construction of a planar laser diode 50 according to a third embodiment of the present invention, wherein those parts corresponding to the parts described previously are designated by the same reference numerals and the description thereof will be omitted.

In the laser diode 50, the electrode 32 has a ring-shaped form and exposes the GaAs cap layer 30 at the central part thereof, wherein the exposed part of the cap layer 30 is covered by an anti-reflection film AR. Further, the waveguide layer 24 and the waveguide layer 28 are replaced respectively by layers 24' and 28 ' each including an alternate stacking of GaAs and AlGaAs. Thereby, the layers 24' and 28 ' act as a mirror and a vertical optical cavity is formed between the layers 24' and 28 '. Generally, the number of the stacked layers is set smaller in the layer 28 ' as compared with the layer 24'.

In such a construction, it should be noted that the optical beam produced by the vertically aligned quantum dots 26b is amplified as it is reflected back and forth in the vertical optical cavity thus formed, and the optical beam thus amplified is emitted from the upper major surface of the cap layer 30, on which the anti-reflection film AR is provided, in the form of a coherent optical beam.

[FOURTH EMBODIMENT]

Figure 18:
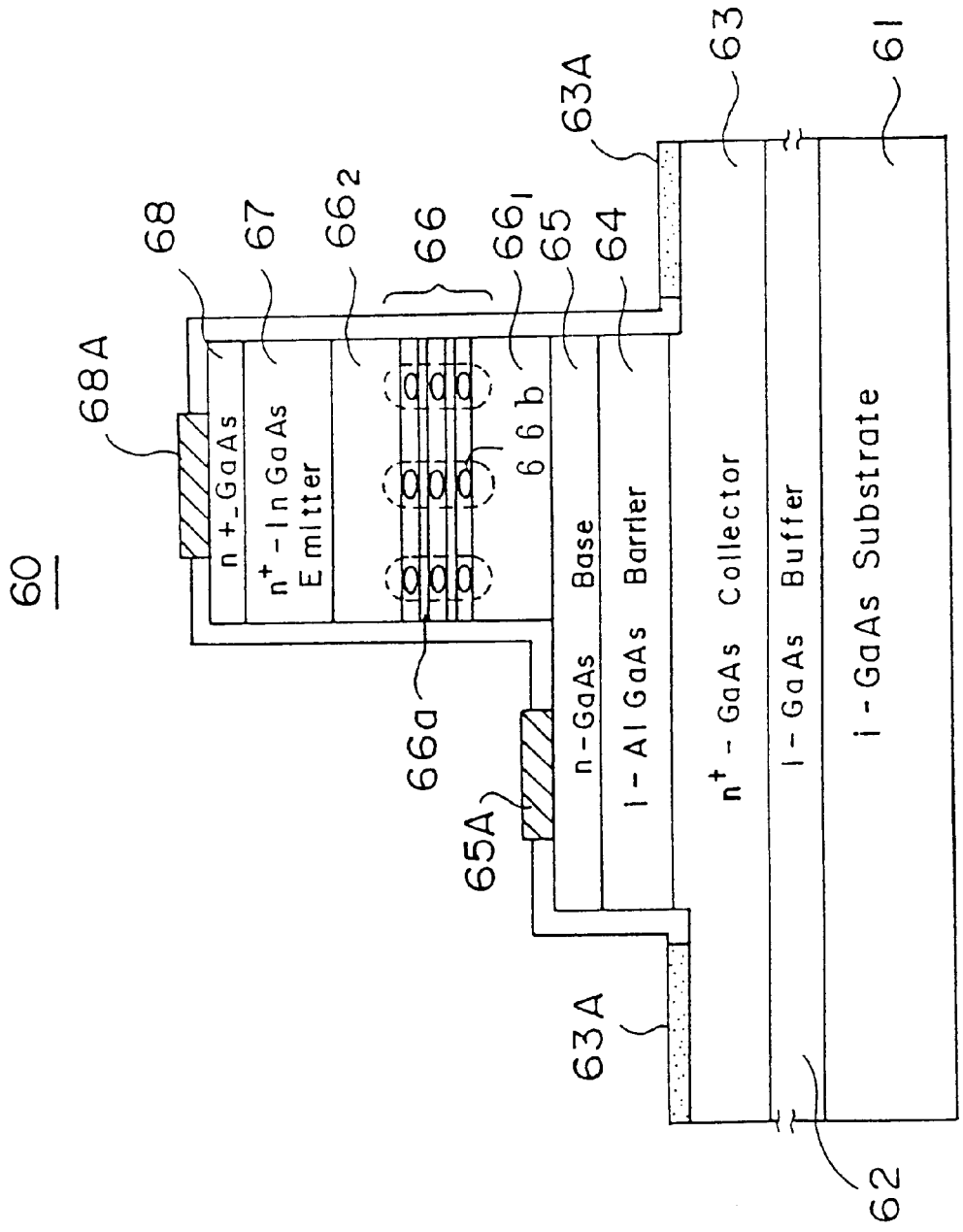
FIG. 18 is a diagram showing the construction of an RHET according to a fourth embodiment of the present invention.

FIG. 18 shows the construction of an RHET 60 according to a fourth embodiment of the present invention.

Referring to FIG. 18, the RHET 60 is formed on a(100)-oriented surface of a semi-insulating GaAs substrate 61, wherein the substrate 61 carries thereon a buffer layer 62 of undoped GaAs and an n-type collector layer 63 formed on the buffer layer 62. The collector layer 63 carries thereon a collector barrier layer 64 of undoped AlGaAs, and a collector electrode 63A is formed on the collector layer 63.

On the barrier layer 64, a base layer 65 of n-type GaAs is provided, and a quantum structure 66 similar to the quantum structure of FIG. 1 is provided on the base layer 65, via an intervening barrier layer $66_1$ of undoped AlAs, as a tunneling barrier structure of the RHET 60. The quantum structure 66 includes a repetitive stacking of an intermediate layer 66a of undoped AlGaAs that buries therein isolated quantum dots 66b of InAs. Because of the reason explained already, the quantum dots 66b thus formed align in the direction generally perpendicular to the principal surface of the substrate.

Further, the quantum structure 66 thus formed carries thereon another barrier layer $66_2$ of undoped AlAs and an emitter layer 67 of n$^+$-type InGaAs having a composition In$_{0.5}$Ga$_{0.5}$As is provided on the barrier layer $66_2$. Further, a cap layer 68 of n$^+$-type GaAs is provided on the emitter layer 67, and an emitter electrode 68A is provided on the cap layer 68, and a base electrode 65A is provided on a part of the base layer 65.

In the RHET of such a construction, the vertically aligned quantum dots 66b form an effectively single quantum dot by efficient quantum mechanical coupling. Thus, a very sharp resonant-tunneling is obtained for the carriers that are injected to the baser layer 65 from the emitter layer 67. Thereby, a precise on-off control is possible for the flow of the carriers reaching the collector layer 63 from the base layer 65 by controlling the potential barrier of the barrier layer 64.

[FIFTH EMBODIMENT]

Figure 19:
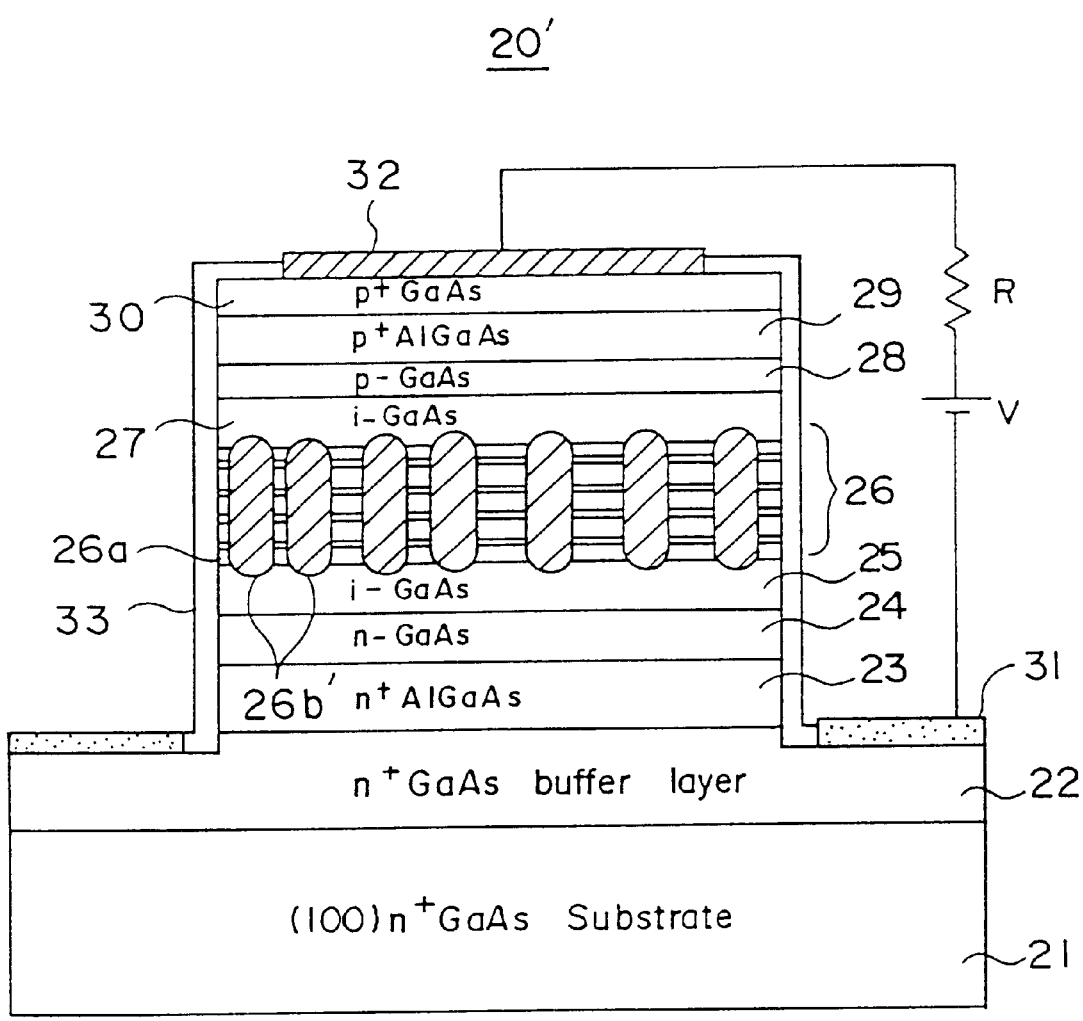
FIG. 19 is a diagram showing the construction of a light-emitting diode according to a fifth embodiment of the present invention.

In each of the foregoing embodiments, it should be noted that the quantum structure may be applied with an annealing process such that the vertically aligned quantum dots are merged with each other as indicated in FIG. 19.

FIG. 19 shows an example of a light-emitting diode 20' in which such an annealing is applied to the structure of FIG. 15, wherein those parts corresponding to the parts described previously are designated by the same reference numerals.

Referring to FIG. 19, it should be noted that the vertically aligned quantum dots 26b of FIG. 15 are now merged with each other as a result of the annealing process to form a physically single quantum dot 26b'. In such a structure, it is expected that the sharpness of the resonant energy spectrum becomes further improved. It should be noted that such an annealing may be contacted at 800° C. for 1 minute.

[SIXTH EMBODIMENT]

Figure 20:
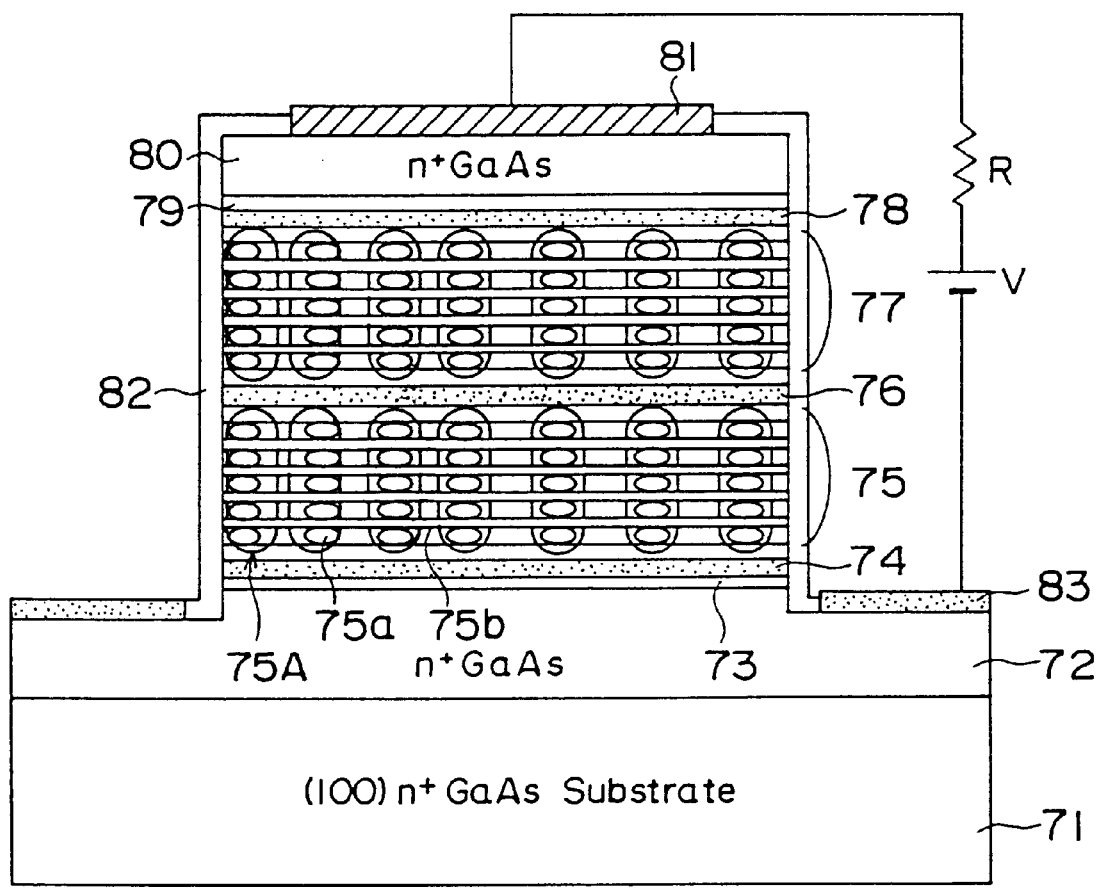
FIG. 20 is a diagram showing the construction of a resonant-tunneling diode according to a sixth embodiment of the present invention.

FIG. 20 shows the construction of a resonant-tunneling diode 70 according to a sixth embodiment of the present invention.

Referring to FIG. 20, the resonant-tunneling diode 70 is formed on a(100)-oriented surface of a substrate 71 of n$^+$-type GaAs and includes a buffer layer 72 of n$^+$-type GaAs formed on the substrate 71 with a thickness of about 300 nm and with a carrier density of $5\times10^{18}$ cm$^{-3}$. The buffer layer 72 carries thereon a thin spacer layer 73 of undoped GaAs typically having a thickness of 5 nm, and an undoped barrier layer 74 of AlAs is formed further on the spacer layer 73 with a thickness of about 2 nm in succession, wherein a quantum structure 75 is formed further on the barrier layer 74 by repeatedly forming a structure in which islands 75a of undoped InAs are buried under an undoped intermediate layer 75b of GaAs. Each of the islands 75a typically has a height of about 5 nm in the freely grown state, while the height of the islands 75a is reduced to about 3 nm, which is the thickness of the intermediate layer 75b, after the deposition of the intermediate layer 75b is made thereon. Such a stacking of the islands 75a and the intermediate layer 75b is repeated seven times, for example. The quantum dots 75a thus formed are aligned generally in the direction perpendicularly to the principal surface of the substrate 71 similarly as before and collectively form an effectively single, large quantum dot 75A as a result of the quantum mechanical coupling of the vertically aligned quantum dots 75a.

On the quantum structure 75 thus formed, another similar quantum structure 77 is formed with an intervening barrier layer 76 of undoped AlAs having a thickness of about 2 nm, wherein the quantum structure 77 is covered in succession by another barrier layer 78 having a thickness of about 2 nm and another spacer layer 79 of undoped GaAs having a thickness of about 5 nm. Further, a contact layer 80 of n$^+$-type GaAs is formed on the spacer layer 79 with a carrier density of $2\times10^{19}$ cm$^{-3}$.

The layered semiconductor body thus formed is further subjected to a mesa etching process to form a mesa structure, and an upper electrode 81 is provided on the contact layer 80 at the top of the mesa structure. Further, a lower electrode 83 is provided on the buffer layer 72 that forms the base of the mesa, and the side wall of the mesa is covered by a protective film 82 of SiO$_2$.

Figure 21:
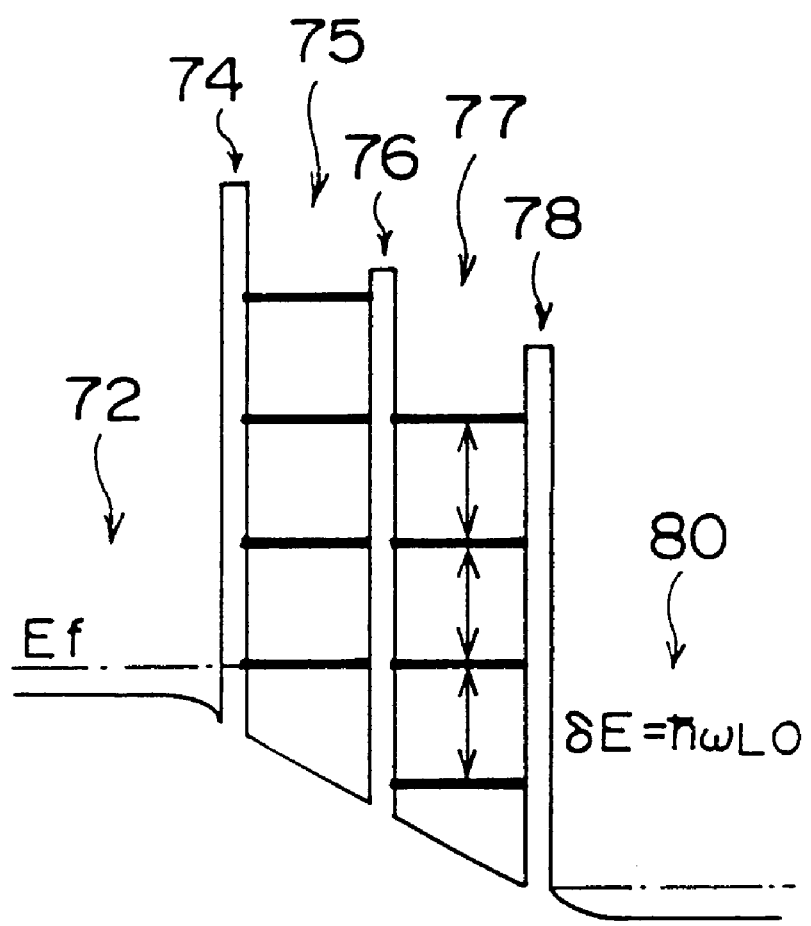
FIG. 21 is a band diagram explaining the operational principle of the resonant-tunneling diode of FIG. 20.

FIG. 21 shows the operation of the resonant-tunneling diode of FIG. 20.

Referring to FIG. 21, the layers 74, 76 and 78 of AlAs form a potential barrier, and quantum levels are formed in each of the quantum structures 75 and 77.

It should be noted that FIG. 21 shows the state in which a dc voltage V is applied across the electrodes 81 and 82 of FIG. 20. As a result of such a biasing, the ground level of the quantum structure 75 and the first order level of the quantum structure 77 coincide with the Fermi level E$_f$ of the GaAs layer 72. In such a resonant state, the electrons injected from the GaAs layer 72 pass through the quantum structures 75 and 77 as hot electrons and reach the GaAs layer 80. When the biasing is changed from the state of FIG. 21, such a resonance disappears and the passage of the electrons is interrupted.

Figure 22:
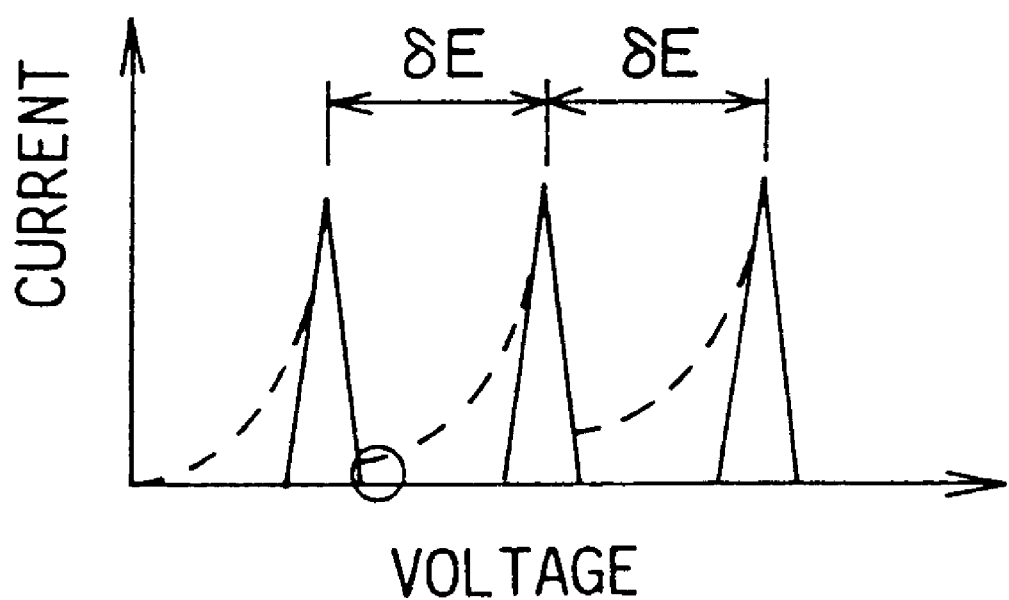
FIG. 22 is a diagram showing the operational characteristics of the resonant-tunneling diode of FIG. 20.

FIG. 22 shows the operational characteristics of the resonant-tunneling diode 70 of FIG. 20.

Referring to FIG. 22, the quantum structures 75 and 77 show a very sharp density of state in each of the quantum levels as a result of the three-dimensional carrier confinement in the quantum dot 75A. No allowable state exists for the carriers when the carrier energy is de-tuned from the quantum levels. Thus, the resonant-tunneling diode 70 of the present embodiment can reduce the leakage current to substantially zero. This is a significant improvement over a corresponding resonant-tunneling diode that uses quantum well wires shown by a broken line in FIG. 22.

Figures 23A, 23B:
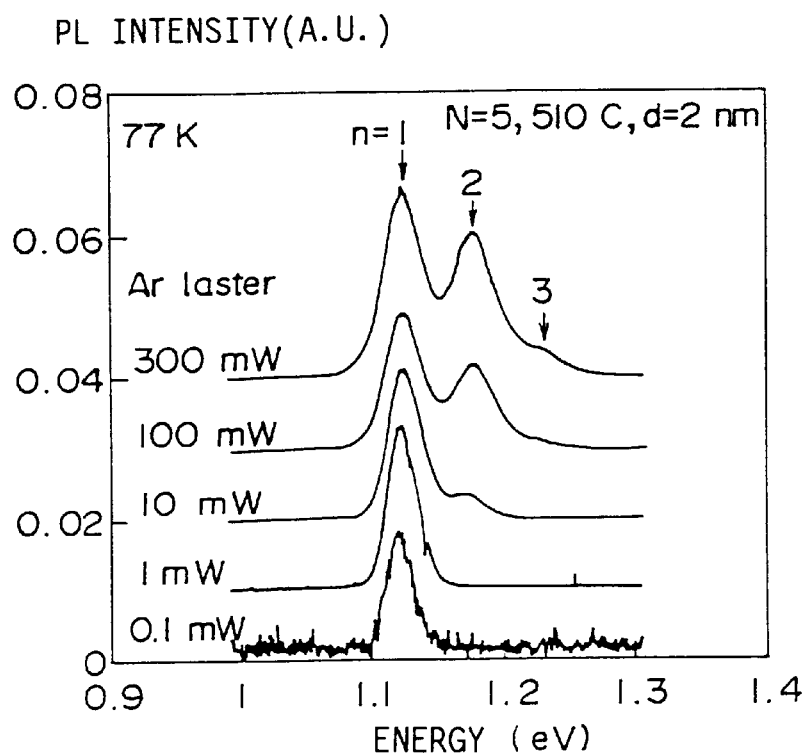
FIGS. 23A and 23B are diagrams showing the PL spectrum of the stacked quantum structure under different deposition conditions.

FIG. 23A shows the PL spectrum of the quantum structure 75 or 77 at 77 K in which the thickness of the intermediate layer 75b is set to 2 nm, wherein the number of the stacks is five. The deposition of the quantum structure is made at 510° C.

As will be seen clearly from FIG. 23A, a plurality of PL peaks are observed in correspondence to the quantum levels shown in FIG. 21 in response to the irradiation of an Ar laser beam, with a mutually equal separation.

FIG. 23B shows the PL spectrum of the quantum structure 75 or 77 for the case in which the thickness of the intermediate layer is set to 3 nm and the deposition temperature is set to 525° C.

In FIG. 23B, a plurality of PL peaks are observed similarly to the case of FIG. 23A, wherein it should be noted in FIG. 23B that the energy interval between adjacent PL peaks is reduced as compared with the case of FIG. 23A. This means that it is possible to change the quantum levels of the effective quantum dots 75A by controlling the deposition temperature, thickness of the intermediate layers and the number of stacked layers. In the example of FIG. 20, the energy interval between adjacent quantum levels is set generally equal to the energy $h/2\pi \cdot \omega_{LO}$ of longitudinal optical (LO) phonons for facilitating the transition of carriers from an excited state to the ground state as will be explained below.

Figure 24:
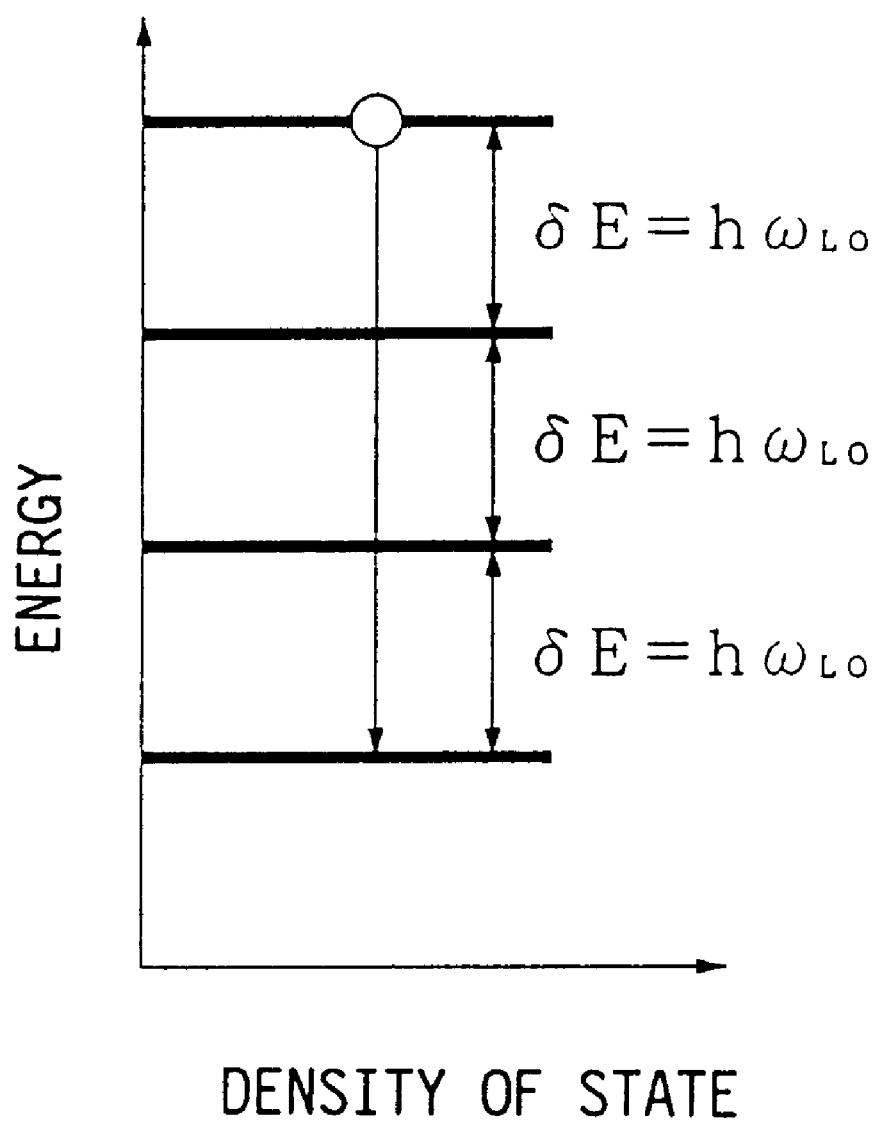
FIG. 24 is a diagram showing a structure for facilitating transition of carriers between states in the quantum structure of the present invention.

In the quantum structure of the present invention as described heretofore, a plurality of very sharp, δ-function-like peaks appear in the state of density as explained heretofore and as indicated in FIG. 24, as a result of the efficient three-dimensional confinement of the carriers. In the system where such three-dimensional confinement of carriers exists, the efficiency or probability of transition of carriers from a first state to an adjacent state is reduced due to the absence of an intermediate state of the carriers between these quantum states. This is known as the phonon bottleneck problem of energy relaxation.

In the present invention, the quantum levels are set such that the energy interval between adjacent quantum levels is generally equal to the LO-phonon energy. Thereby, the transition occurs between the quantum levels easily and efficiently by emitting or absorbing LO-phonons.

It should be noted that the foregoing explanation applies not only to the resonant-tunnel diode 70 of FIG. 20 but to all of the embodiments described heretofore.

In the embodiments described heretofore, quantum dots are formed by the islands of InAs formed on a GaAs layer. However, the present invention is by no means limited to such a specific combination of the materials but is applicable to any combination of semiconductor materials that form a strained heteroepitaxial system.

For example, the intermediate layer 26a of GaAs of FIG. 15 may be replaced by InGaAs. Further, the quantum dots 26b may be formed of InGaAs in place of InAs. Alternately, the intermediate layer 26a may be formed of AlGaAs or InGaP, and the quantum dots 26b may be formed of InP, GaSb or InGaSb.

When the quantum dots 26b are formed of InAs and InP is used for the intermediate layer 26a, the quantum dots 26b have a height of about 7.6 nm in the freely grown state. Thus, it is preferably to set the thickness of the intermediate layer 26a to be 7.6 nm or less. For example, the intermediate layer 26a may be formed to have a thickness of four molecular layers or less.

When the quantum dots 26b are formed of any of AlSb, InSb and GaSb and GaAs is used for the intermediate layer 26a, the quantum dots 26b have a height of about 8.7 nm in the freely grown state. Thus, it is preferably to set the thickness of the intermediate layer 26a to be 8.7 nm or less. For example, the intermediate layer 26a may be formed with a thickness of four molecular layers or less.

When the quantum dots 26b are formed of GaInSb and GaSb is used for the intermediate layer 26a, it is preferred that the intermediate layer 26a has a thickness of four molecular layers or less.

When the quantum dots 26b are formed of InP and InGaP is used for the intermediate layer 26a, the quantum dots 26b have a height of about 5 nm in the freely grown state. Thus, it is preferable to set the as thickness of the intermediate layer 26a to be 5 nm or less. For example, the intermediate layer 26a may be formed with a thickness of two molecular layers or less.

Further, in each of the embodiments described heretofore, it is preferable to set the composition of the intermediate layers such that the lattice misfit between the intermediate layer and the substrate is smaller than about 7%.

Further, the present invention is not limited to the embodiments described heretofore, but various variations and modifications may be made without departing from the scope of the invention.

What is claimed is:

1. A quantum semiconductor device, comprising:
   a semiconductor substrate;
   an active layer formed on said semiconductor substrate and including a quantum structure;
   said quantum structure comprising:
      a plurality of intermediate layers stacked on each other repeatedly, each of said plurality of intermediate layers having a substantially flat top surface and being formed on a first semiconductor crystal having a first lattice constant;
      each of said intermediate layers including a plurality of quantum dots of a second semiconductor crystal having a second lattice constant different from said first lattice constant, said second semiconductor crystal forming thereby a strained system with respect to said first semiconductor crystal, each of said quantum dots in an intermediate layer having a height substantially identical with a thickness of said intermediate layer, and each of said intermediate layers has a thickness smaller than a height of said quantum dots in a freely grown state;
      said quantum dot in an intermediate layer aligning with another quantum dot in an adjacent intermediate layer in a direction perpendicular to a principal surface of said semiconductor substrate;
      each of said plurality of intermediate layers having a thickness equal to or smaller than a Bohr-radius of carriers in said intermediate layer.

2. The quantum semiconductor device as claimed in claim 1, wherein each of said quantum dots is contacted with another quantum dot located immediately thereabove.

3. The quantum semiconductor device as claimed in claim 1, wherein each of said intermediate layers has a substantially flat upper major surface.

4. The quantum semiconductor device as claimed in claim 1, wherein each of said quantum dots is formed of InAs and each of said intermediate layers is formed of GaAs, and wherein each of said intermediate layers has a thickness of 3 nm or less but not smaller than 1 nm.

5. The quantum semiconductor device as claimed in claim 4, wherein each of said intermediate layers has a thickness between 2 and 3 nm.

6. The quantum semiconductor device as claimed in claim 1, wherein each of said quantum dots is formed of InAs and each of said intermediate layers is formed of InP, and wherein each of said intermediate layers has a thickness of 7.6 nm or less.

7. The quantum semiconductor device as claimed in claim 1, wherein each of said quantum dots is selected from a group consisting of AlSb, InSb and GaSb and each of said intermediate layer is formed of GaAs, and wherein each of said intermediate layers has a thickness of 8.7 nm or less.

8. The quantum semiconductor device as claimed in claim 1, wherein each of said quantum dots is formed of GaInSb and each of said intermediate layers is formed of GaSb, and wherein each of said intermediate layers has a thickness of four molecular layers or less.

9. The quantum semiconductor device as claimed in claim 1, wherein each of said quantum dots is formed of InP and each of said intermediate layers is formed of InGaP, and wherein each of said intermediate layers has a thickness of 5 nm or less.

10. The quantum semiconductor device as claimed in claim 1, wherein a quantum dot in an intermediate layer is merged to a quantum dot in an adjacent intermediate layer.

11. A quantum semiconductor device, comprising;
a semiconductor substrate;
a first cladding layer provided on said semiconductor substrate;
an active layer provided on said first cladding layer and including a quantum structure;
a second cladding layer provided on said active layer;
a first electrode provided on said semiconductor substrate for injecting carriers of a first type into said active layer via said first cladding layer;
a second electrode provided on said second cladding layer for injecting carriers of a second type into said active layer via said second cladding layer;
said quantum structure comprising:
a plurality of intermediate layers stacked on each other repeatedly, each of said plurality of intermediate layers having a substantially flat top surface and being formed on a first semiconductor crystal having a first lattice constant;
each of said intermediate layers including a plurality of quantum dots of a second semiconductor crystal having a second lattice constant different from said first lattice constant, said second semiconductor crystal forming thereby a strained system with respect to said first semiconductor crystal, each of said quantum dots in an intermediate layer having a height substantially identical with a thickness of said intermediate layer, and each of said intermediate layers has a thickness smaller than a height of said quantum dots in a freely grown state;
a quantum dot in an intermediate layer aligning with another quantum dot in an adjacent intermediate layer in a direction perpendicular to a principal surface of said semiconductor substrate;
each of said plurality of intermediate layers having a thickness equal to or smaller than a Bohr-radius of carriers in said intermediate layer.

12. The optical semiconductor device as claimed in claim 11, wherein each of said quantum dots is contacted with another quantum dot located immediately thereabove.

13. The optical semiconductor device as claimed in claim 11, wherein each of said intermediate layers has a substantially flat upper major surface.

14. The optical semiconductor device as claimed in claim 11, wherein each of said quantum dots is formed of InAs and each of said intermediate layers is formed of GaAs, and wherein each of said intermediate layers has a thickness of 3 nm or less but not smaller than 1 nm.

15. The optical semiconductor device as claimed in claim 14, wherein each of said intermediate layers has a thickness between 2 and 3 nm.

16. The optical semiconductor device as claimed in claim 11, wherein each of said quantum dots is formed of InAs and each of said intermediate layers is formed of InP, and wherein each of said intermediate layers has a thickness of 7.6 nm or less.

17. The optical semiconductor device as claimed in claim 11, wherein each of said quantum dots is selected from a group consisting of AlSb, InSb and GaSb and each of said intermediate layers is formed of GaAs, and wherein each of said intermediate layers has a thickness of 8.7 nm or less.

18. The optical semiconductor device as claimed in claim 11, wherein each of said quantum dots is formed of GaInSb and each of said intermediate layers is formed of GaSb, and wherein each of said intermediate layers has a thickness of four molecular layers or less.

19. The optical semiconductor device as claimed in claim 11, wherein each of said quantum dots is formed of InP and each of said intermediate layers is formed of InGaP, and wherein each of said intermediate layers has a thickness of 5 nm or less.

20. The optical semiconductor device as claimed in claim 11, wherein a quantum dot in an intermediate layer is merged to a quantum dot in an adjacent intermediate layer.

21. A method of fabricating a quantum semiconductor device including a quantum dot structures comprising the steps of:
(a) growing quantum dots epitaxially on a substrate in the form of mutually isolated islands, each of said quantum dots forming a strained system with respect to said semiconductor substrate;
(b) growing a semiconductor layer epitaxially on said semiconductor substrate so as to bury said quantum dots to form an intermediate layer, said semiconductor layer forming said intermediate layer forming a lattice matching with respect to said semiconductor substrate;
(c) growing quantum dots epitaxially on said intermediate layer in the form of mutually isolated islands, each of said quantum dots grown on said intermediate layer forming a strained system with respect to said semiconductor substrate;
(d) growing a semiconductor layer epitaxially on said intermediate layer formed in said step (b) so as to bury said quantum dots formed in said step (c) as a next intermediate layer, said semiconductor layer forming said next intermediate layer forming a lattice matching with respect to said semiconductor substrate;
said steps (c) and (d) being carried out alternately and repeatedly, said intermediate layer being formed, in each of said steps (b) and (d) such that said intermediate layer has a thickness smaller than a height of said quantum dots in a state that said quantum dots are grown freely.

22. The method as claimed in claim 21, wherein said height of said quantum dots decreases in each of said steps (b) and (d) to be substantially equal to said thickness of said intermediate layer.

23. The method as claimed in claim 21, wherein each of said quantum dots is formed of InAs and each of said intermediate layers is formed of GaAs, and wherein each of said intermediate layers has a thickness of 3 nm or less but not smaller than 1 nm.

24. The method as claimed in claim 23, wherein each of said intermediate layers has a thickness between 2 and 3 nm.

25. The method as claimed in claim 21, wherein each of said quantum dots is formed of InAs and each of said intermediate layers is formed of InP, and wherein each of said intermediate layers has a thickness of 7.6 nm or less.

26. The method as claimed in claim 21, wherein each of said quantum dots is selected from a group consisting of AlSb, InSb and GaSb and each of said intermediate layers is formed of GaAs, and wherein each of said intermediate layers has a thickness of 8.7 nm or less.

27. The method as claimed in claim 21, wherein each of said quantum dots is formed of GaInSb and each of said intermediate layers is formed of GaSb, and wherein each of said intermediate layers has a thickness of four molecular layers or less.

28. The method as claimed in claim 21, wherein each of said quantum dots is formed of InP and each of said intermediate layers is formed of InGaP, and wherein each of said intermediate layers has a thickness of 5 nm or less.

29. The method as claimed in claim 21, wherein a quantum dot in an intermediate layer is merged to a quantum dot in an adjacent intermediate layer.

30. A resonant-tunneling diode, comprising:

a semiconductor substrate;

a first quantum structure formed on said semiconductor substrate;

a barrier layer formed on said first quantum structure, said barrier layer forming a potential barrier; and a second quantum structure formed on said semiconductor substrate;

a cap layer provided on said second quantum structure;

a first electrode provided in electric contact with said semiconductor substrate; and a second electrode provided in electric contact with said cap layer;

each of said first and second quantum structures comprising:

a plurality of intermediate layers stacked on each other repeatedly, each of said plurality of intermediate layers having a substantially flat top surface and being formed on a first semiconductor crystal having a first lattice constant;

each of said intermediate layers including a plurality of quantum dots of a second semiconductor crystal having a second lattice constant different from said first lattice constant, said second semiconductor crystal forming thereby a strained system with respect to said first semiconductor crystal, each of said quantum dots in an intermediate layer having a height substantially identical with a thickness of said intermediate layer, and each of said intermediate layers has a thickness smaller than a height of said quantum dots in a freely grown state;

a quantum dot in an intermediate layer aligning with another quantum dot in an adjacent intermediate layer in a direction perpendicular to a principal surface of said semiconductor substrate;

each of said plurality of intermediate layers having a thickness equal to or smaller than a Bohr-radius of carriers in said intermediate layer;

said quantum dots aligning in each of said first and second quantum structures forming collectively a single effective quantum dot having quantum levels.

31. A quantum semiconductor device as claimed in claim 1, wherein said quantum levels are separated from each other by an energy corresponding to an energy of longitudinal optical phonons.

32. A quantum semiconductor device as claimed in claim 11, wherein said quantum levels are separated from each other by an energy corresponding to an energy of longitudinal optical phonons.

* * * * *